United States Patent
Toizumi et al.

(10) Patent No.: US 10,274,573 B2
(45) Date of Patent: Apr. 30, 2019

(54) MONITORING SYSTEM, MONITORING DEVICE AND METHOD OF OPERATING THE SAME, SERVER AND METHOD OF OPERATING THE SAME, AND NON-TRANSITORY STORAGE MEDIUM

(71) Applicant: NEC Corporation, Tokyo (JP)

(72) Inventors: Takahiro Toizumi, Tokyo (JP); Eisuke Saneyoshi, Tokyo (JP); Katsuya Suzuki, Tokyo (JP); Kosuke Homma, Tokyo (JP); Ryo Hashimoto, Tokyo (JP); Koji Kudo, Tokyo (JP)

(73) Assignee: NEC Corporation, Tokyo (JP)

( * ) Notice: Subject to any disclaimer, the term of this patent is extended or adjusted under 35 U.S.C. 154(b) by 318 days.

(21) Appl. No.: 15/314,766

(22) PCT Filed: Mar. 13, 2015

(86) PCT No.: PCT/JP2015/057549
§ 371 (c)(1),
(2) Date: Nov. 29, 2016

(87) PCT Pub. No.: WO2015/182217
PCT Pub. Date: Dec. 3, 2015

(65) Prior Publication Data
US 2017/0199265 A1    Jul. 13, 2017

(30) Foreign Application Priority Data
May 29, 2014    (JP) .................................. 2014-111331

(51) Int. Cl.
*G01R 15/12*    (2006.01)
*G01R 21/06*    (2006.01)
(Continued)

(52) U.S. Cl.
CPC ........... *G01R 35/005* (2013.01); *G01D 4/004* (2013.01); *G01R 21/133* (2013.01);
(Continued)

(58) Field of Classification Search
CPC ....... G01R 15/12; G01R 15/18; G01R 15/144; G01R 21/06; G01R 21/133; G01R 13/04
See application file for complete search history.

(56) References Cited

U.S. PATENT DOCUMENTS 8,736,457 B2 *   5/2014   Hasuo ................... H02J 13/001
                                                        340/664
9,513,141 B2 *  12/2016   Kudo ..................... G01D 4/002
(Continued)

FOREIGN PATENT DOCUMENTS

JP        3403368        5/2003
JP        4433890        3/2010
(Continued)

OTHER PUBLICATIONS

International Search Report and Written Opinion dated Jun. 2, 2015, in corresponding PCT International Application.

*Primary Examiner* — Minh N Tang
(74) *Attorney, Agent, or Firm* — Finnegan, Henderson, Farabow, Garrett & Dunner, L.L.P.

(57) ABSTRACT

A monitoring system including a plurality of monitoring devices (20) and a server (10) is provided. When new device data including a feature amount of a new electrical device different form existing electrical devices is extracted from measurement data (current consumption or the like), the monitoring device (20) calibrates the feature amount of the new electrical device using calibration data generated based on calibration data of the exiting electrical device, and transmits the new device data to the server (10) in association with identification information of the new electrical device. When the calibrated new device data of the new
(Continued)

electrical device is received from the plurality of monitoring devices (20), the server (10) generates and registers training data of the new electrical device based on the plurality of pieces of calibrated new device data.

14 Claims, 23 Drawing Sheets

(51) Int. Cl.
| | |
|---|---|
| *G01R 35/00* | (2006.01) |
| *G06Q 10/00* | (2012.01) |
| *G01R 21/133* | (2006.01) |
| *G06N 99/00* | (2019.01) |
| *G01D 4/00* | (2006.01) |
| *G01R 22/06* | (2006.01) |
| *G06Q 50/06* | (2012.01) |

(52) U.S. Cl.
CPC ......... *G01R 22/063* (2013.01); *G06N 99/005* (2013.01); *G06Q 10/00* (2013.01); *G06Q 50/06* (2013.01); *Y02B 70/3266* (2013.01); *Y02B 90/242* (2013.01); *Y04S 20/242* (2013.01); *Y04S 20/322* (2013.01); *Y04S 20/38* (2013.01)

(56) References Cited

U.S. PATENT DOCUMENTS

| | | | |
|---|---|---|---|
| 2011/0251807 A1* | 10/2011 | Rada | G01D 4/00 |
| | | | 702/61 |
| 2012/0004871 A1* | 1/2012 | Tsao | G01R 19/2513 |
| | | | 702/61 |
| 2012/0150461 A1 | 6/2012 | Ohiwa et al. | |
| 2012/0290232 A1 | 11/2012 | Kudo et al. | |
| 2012/0313789 A1 | 12/2012 | Hasuo et al. | |

FOREIGN PATENT DOCUMENTS

| | | |
|---|---|---|
| JP | 2010-210575 | 9/2010 |
| JP | 2012-122966 | 6/2012 |
| JP | 2012-255744 | 12/2012 |
| JP | 2013-44736 | 3/2013 |
| WO | WO 2011/067988 A1 | 6/2011 |
| WO | WO 2013/157031 A1 | 10/2013 |

* cited by examiner

FIG. 4

| TRAINING DATA ID | ELECTRICAL DEVICE ID | FEATURE AMOUNT |
|---|---|---|
| 00001 | T - 00001 | × × × |
| 00002 | T - 00002 | × × ○ |
| ⋮ | ⋮ | ⋮ |

FIG. 6

| TRAINING DATA ID | ELECTRICAL DEVICE ID | DEVICE NAME | FEATURE AMOUNT | CALIBRATION DATA |
|---|---|---|---|---|
| 00010 | A - 00001 | LIVING ROOM AIR CONDITIONER | ○○○○ | AAAA |
| 00083 | A - 00801 | BEDROOM AIR CONDITIONER | ○○△○ | BABA |
| ⋮ | ⋮ | ⋮ | ⋮ | ⋮ |

FIG. 7

| SUM TRAINING DATA ID | TRAINING DATA ID | FEATURE AMOUNT |
|---|---|---|
| B0001 | 00010, 00083 | × × × × |
| B0002 | 00010, 00083, 07021 | × ○ × ○ |
| ⋮ | ⋮ | ⋮ |

FIG. 13

| TRAINING DATA ID | ELECTRICAL DEVICE ID | DEVICE NAME | POWER CONSUMPTION | FEATURE AMOUNT | CALIBRATION DATA |
|---|---|---|---|---|---|
| 00010-1 | A - 00001 | LIVING ROOM AIR CONDITIONER | ○○○ w | ○○○× | AAAA |
| 00010-2 | A - 00001 | LIVING ROOM AIR CONDITIONER | ××× w | ○○×○ | AAAA |
| ⋮ | ⋮ | ⋮ | ⋮ | ⋮ | ⋮ |

FIG. 14

| SUM TRAINING DATA ID | TRAINING DATA ID | FEATURE AMOUNT |
|---|---|---|
| B000001 | 00010-1, 00083-2 | ×○○×○ |
| ⋮ | ⋮ | ⋮ |

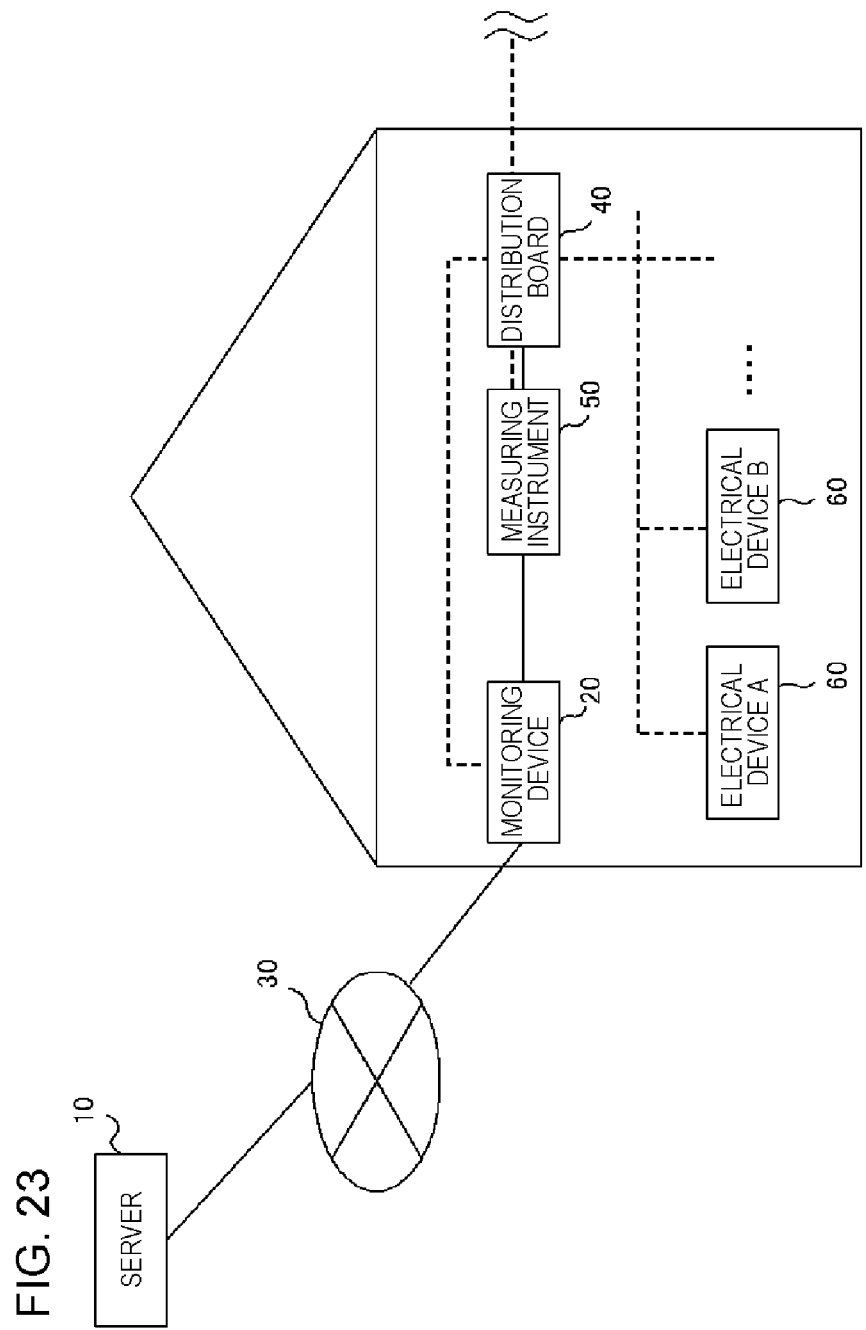

US 10,274,573 B2

MONITORING SYSTEM, MONITORING DEVICE AND METHOD OF OPERATING THE SAME, SERVER AND METHOD OF OPERATING THE SAME, AND NON-TRANSITORY STORAGE MEDIUM

CROSS-REFERENCE TO RELATED PATENT APPLICATIONS

This application is a National Stage Entry of International Application No. PCT/JP2015/057549, filed Mar. 13, 2015, which claims priority from Japanese Patent Application No. 2014-111331, filed May 29, 2014. The entire contents of the above-referenced applications are expressly incorporated herein by reference.

TECHNICAL FIELD

The present invention relates to a monitoring system, a monitoring device and a method of operating the same, a server and a method of operating the same, and a program.

BACKGROUND ART

In recent years, with spreading of smart meters, functions of providing total power consumption values (instantaneous values or the like) in predetermined monitoring units (electrical device groups consuming power in each household, each company, one floor of a building, or the like) to users have been standardized. By providing not only the total power consumption values in the predetermined monitoring units but also power consumption values (instantaneous values or the like) of respective electrical devices included in the predetermined monitoring unit, more precise energy saving measures are expected to be stimulated.

Power consumption of an individual electrical device can be ascertained, for example, by mounting a measuring instrument on each electrical device. However, in the case of this technique, a work burden of mounting a measuring instrument on each electrical device is considerable. Further, a cost burden increases since the number of measurement instruments increases with an increase in the number of electrical devices.

Patent Document 1 discloses a technology for installing a measuring instrument in a power trunk line portion such as a power-feeding service entrance or a distribution board and inferring an operation state of each electrical device using measurement data (a total current consumption waveform or the like) measured with the measuring instrument. In the technology, a feature amount (training feature amount) at the time of operation of each electrical device and a feature amount (training feature amount) at the time of operation of the plurality of electrical devices are prepared in advance. Then, based on feature amounts extracted from the measurement data measured in the power trunk line portion and the training feature amounts prepared in advance, an operation state of each electrical device is inferred.

Patent Document 2 discloses a technology for generating a training feature amount indicating a feature amount at the time of operation of each electrical device. Specifically, pieces of predetermined data (current consumption or the like) are individually measured by operating electrical devices in a house to be measured one by one. A feature amount is extracted from the measured data of each of the electrical devices and the extracted feature amount is stored as a training feature amount.

Related technologies are disclosed in Patent Documents 3 and 4.

Patent Document 3 discloses a technology for inferring operation states of electrical devices using feature amount information of electrical devices open to the public and existing on a network. For example, it is disclosed that manufacturers or sellers of the electronic devices opens feature amount information of electrical devices to the public on networks in advance.

Patent Document 4 discloses a technology for inferring operation situations of electrical devices with high precision even when voltage waveforms applied to the electrical devices vary. According to this technology, an operation situation of an electrical device is inferred using data of a predetermined section other than a section in which a variation in a harmonic current with respect to a variation in a power-supply voltage is greater than a standard.

RELATED DOCUMENT

Patent Document

[Patent Document 1] Japanese Patent No. 3403368
[Patent Document 2] Japanese Patent No. 4433890
[Patent Document 3] Japanese Unexamined Patent Application Publication No. 2010-210575
[Patent Document 4] Japanese Unexamined Patent Application Publication No. 2013-44736

SUMMARY OF THE INVENTION

The present inventors have examined technologies for executing unified management on training data of a plurality of respective electrical devices with a server and supplying training data from the server to each of a plurality of monitoring devices that infer operation states of the electrical devices in correspondence with each monitoring unit. According to this technology, it is possible to reduce a load for preparing the training data in each monitoring unit compared to the technologies disclosed in Patent Documents 1 and 2.

However, in the related art, a technique for efficiently generating training data for unified management with a server and storing the training data in the server has not been proposed. Patent Document 3 discloses a technology in which manufacturers, sellers, or the like of the electrical devices open feature amount information of electrical devices to public on a network in advance. In the case of this technology, the manufacturers, sellers, or the like of the electrical devices have to execute works of generating feature amount information, and thus labors are necessary. Techniques to solve the problem are not disclosed in any of Patent Documents 1, 2, and 4.

The invention provides a new technology for managing training data of a plurality of respective electrical devices with a server.

According to an aspect of the invention, there is provided a monitoring system including: a plurality of monitoring devices; and a server that communicates with each of the plurality of monitoring devices. The monitoring devices each include a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data, a calibration data generation unit that generates first calibration data of the new electrical device based on the calibration data of the existing electrical devices, a calibration unit that calibrates the new device data based on the first calibration data, a reception unit that receives an input of identification information of the new electrical device, and a transmission unit that associates the identification information of the new electrical device with the new device data calibrated based on the first calibration data and transmits the identification information and the calibrated new device data to the server. The server includes a signal reception unit that receives the calibrated new device data and the identification information of the new electrical device from the plurality of monitoring devices, and a training data generation unit that generates the training data of the new electrical device based on the calibrated new device data of the new electrical device received from each of the plurality of monitoring devices and registers the training data in a training data storage unit.

According to another aspect of the invention, there is provided a monitoring device including: a monitoring unit that, based on measurement data at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data, a calibration data generation unit that generates first calibration data of the new electrical device based on the calibration data of the existing electrical devices, a calibration unit that calibrates the new device data based on the first calibration data, a reception unit that receives an input of identification information of the new electrical device, and a transmission unit that associates the identification information of the new electrical device with the new device data calibrated based on the first calibration data and transmits the identification information and the calibrated new device data to a server.

According to still another aspect of the invention, there is provided a server including: a signal reception unit that receives new device data which includes a feature amount of a new electrical device extracted from measurement data at least one among current consumption, power consumption, and an input voltage and is obtained after calibrating a variation occurring in the measurement data depending on an installation environment of the new electrical device, and identification information of the new electrical device from a plurality of monitoring devices; and a training data generation unit that generates the training data of the new electrical device based on the calibrated new device data of the new electrical device received from each of the plurality of monitoring devices and registers the training data in a training data storage unit.

According to still another aspect of the invention, there is provided a program causing a computer to function as: a monitoring unit that, based on measurement data at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data, a calibration data generation unit that generates first calibration data of the new electrical device based on the calibration data of the existing electrical devices, a calibration unit that calibrates the new device data based on the first calibration data, a reception unit that receives an input of identification information of the new electrical device, and a transmission unit that associates the identification information of the new electrical device with the new device data calibrated based on the first calibration data and transmits the identification information and the calibrated new device data to a server.

According to still another aspect of the invention, there is provided a program causing a computer to function as: a signal reception unit that receives new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and a training data generation unit that generates the training data of the new electrical device based on the calibrated new device data of the new electrical device received from each of the plurality of monitoring devices and registers the training data in a training data storage unit.

According to still another aspect of the invention, there is provided a monitoring device operation method of causing a computer to execute: a monitoring step of, based on measurement data at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracting new device data including the feature amount of a new electrical device different from the existing electrical devices from the measurement data, a calibration data generation step of generating first calibration data of the new electrical device based on the calibration data of the existing electrical devices, a calibration step of calibrating the new device data based on the first calibration data, a reception step of receiving an input of identification information of the new electrical device, and a transmission step of associating the identification information of the new electrical device with the new device data calibrated based on the first calibration data and transmitting the identification information and the calibrated new device data to a server.

According to still another aspect of the invention, there is provided a server operation method of causing a computer to execute: a signal reception step of receiving new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and a training data generation step of generating the training data of the new electrical device based on the calibrated new device data of the new electrical device received from each of the plurality of monitoring devices and registering the training data in a training data storage unit.

According to the invention, it is possible to realize the new technology for managing the training data of the plurality of respective electrical device with the server.

BRIEF DESCRIPTION OF THE DRAWINGS

The above-described objects, other objects, features, and advantages will be apparent throughout preferred exemplary embodiments to be described below and the following drawings appended to the exemplary embodiments.

FIG. 4 is a diagram schematically illustrating an example of information managed by a server 10 according to the exemplary embodiment.

FIG. 6 is a diagram schematically illustrating an example of information managed by the monitoring device 20 according to the exemplary embodiment.

FIG. 7 is a diagram schematically illustrating an example of information managed by the monitoring device 20 according to the exemplary embodiment.

FIG. 13 is a diagram schematically illustrating an example of information managed by the monitoring device 20 according to the exemplary embodiment.

FIG. 14 is a diagram schematically illustrating an example of information managed by the monitoring device 20 according to the exemplary embodiment.

FIG. 23 is a diagram schematically illustrating an application example of the monitoring system according to the exemplary embodiment.

DESCRIPTION OF EXEMPLARY EMBODIMENTS

Hereinafter, a hardware configuration of a device according to a present exemplary embodiment will be described. Each unit included in the device according to the present exemplary embodiment is achieved by any combination of hardware and software with a focus on a central processing unit (CPU), a memory, a program loaded on the memory (also including a program which is stored in the memory in advance when shipping out the device and a program which is downloaded from a storage medium such as a compact disc (CD), or a server or the like on the Internet) of any computer, a storage unit such as a hard disk which stores the program, and an interface for network connection. In addition, those skilled in the art can understand that various modifications can be made to examples for realizing the method and device.

Figure 1:
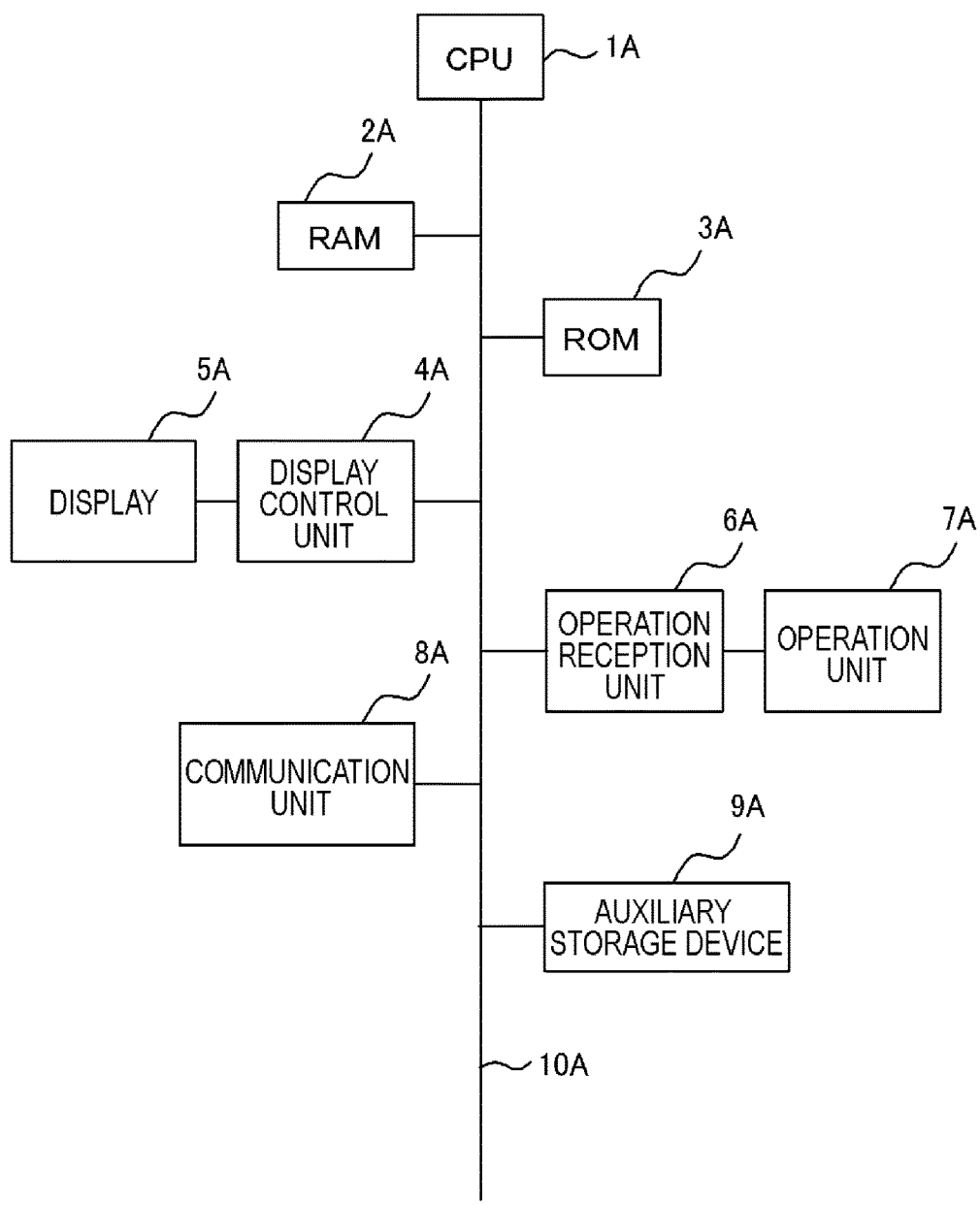
FIG. 1 is a diagram conceptually illustrating an example of a hardware configuration of a device according to an exemplary embodiment.

FIG. 1 is a diagram conceptually illustrating an example of a hardware configuration of the device according to the exemplary embodiment. As illustrated, the device according to the exemplary embodiment includes, for example, a CPU 1A, a random access memory (RAM) 2A, a read-only memory (ROM) 3A, a display control unit 4A, a display 5A, an operation reception unit 6A, an operation unit 7A, a communication unit 8A, and an auxiliary storage device 9A connected to each other through a bus 10A. Although not illustrated, the device may additionally include other elements such as input and output interfaces connected to external devices in a wired manner, a microphone, and a speaker.

The CPU 1A controls each element and an entire computer of the device. The ROM 3A includes areas which store a program causing a computer to operate or various application program and various kinds of setting data used when such a program operates. The RAM 2A includes an area which temporarily stores data, such as a work area in which a program operate. The auxiliary storage device 9A is, for example, a hard disk drive (HDD) and can store large-volume data.

The display 5A is configured as, for example, a display device (for example, a light emitting diode (LED) display, a liquid crystal display, or an organic electroluminescence (EL) display). The display 5A may be a touch panel display integrated with a touch pad. The display control unit 4A reads data stored in a video RAM (VRAM), executes a predetermined process on the read data, and then transmits the data to the display 5A to display various screens. The operation reception unit 6A receives various operations through the operation unit 7A. The operation unit 7A includes an operation key, an operation button, a switch, a jog dial, a touch panel display, and a keyboard. The communication unit 8A is connected to a network such as the Internet or a local area network (LAN) in a wired and/or wireless manner to communicate with other electrical device.

Hereinafter, the present exemplary embodiment will be described. Functional block diagrams used to describe the following exemplary embodiments illustrate blocks in units of functions rather than configurations in units of hardware. In the drawings, each device is constituted by a single device in the description, but constitution methods are not limited thereto. That is, each device may, of course, have a physically divided configuration or a logically divided configuration. The same reference numerals are given to the same constituent elements and the description thereof will not be appropriately repeated.

<First Exemplary Embodiment>

First, an overview of a monitoring system according to the present exemplary embodiment will be described. In the present exemplary embodiment, each monitoring device installed to correspond to each monitoring unit including a plurality of electrical devices acquires measurement data of a predetermined electrical device included in each monitoring unit. Then, the monitoring device extracts a feature amount from the measurement data, executes a necessary process thereon, and subsequently transmits the data to the server. The server collects data of various electrical devices from a plurality of monitoring devices. Then, the server generates training data of each electrical device based on the collected data. In this way, the server generates the pieces of training data of the various electrical devices and executes unified management.

Thereafter, the server supplies the training data of the predetermined electrical device to each monitoring device in response to a request from each of the plurality of monitoring devices. The monitoring device receiving the training data from the server infers operation states of the electrical devices included in the corresponding monitoring unit using the received training data.

Figure 2:
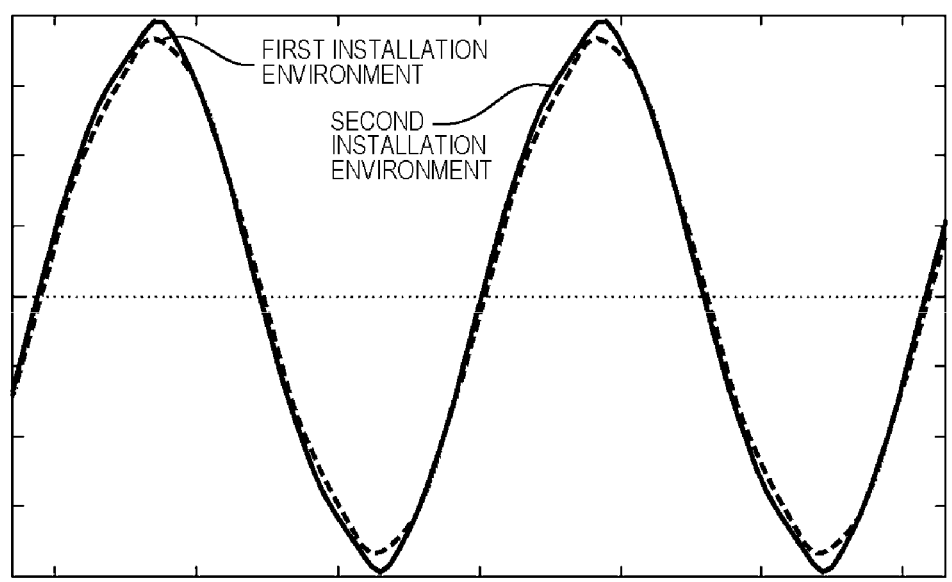
FIG. 2 is a diagram illustrating an operational effect according to the exemplary embodiment.

Incidentally, even for measurement data when the same electrical device is similarly operated, when an installation environment of the electrical device is different, the measurement data also varies. As a result, a feature amount extracted from the measurement data also varies. An example is illustrated in FIG. 2. FIG. 2 illustrates measurement data when the same electrical devices placed in different first and second installation environments are similarly operated. As illustrated, pieces of mutual measurement data are not completely identical, but a deviation occurs. The feature amounts extracted from the measurement data include mutually different values.

There are various causes which result in a variation in the measurement data. For example, an interconnect state in each monitoring unit, in specific, the length of an interconnect between an electrical device and a measuring instrument that measures a current consumption, power consumption, voltage consumption, or the like, the length of an interconnect from a distribution board to each socket to which each electrical device is connected, the number of branches from the distribution board, the length of a cable included in each electrical device, whether there is an extension cord between the socket and each electrical device, and the length of the extension cord in a case in which there is the extension cord, are considered. Additionally, the number or the kinds of electrical devices belonging to the same branch and connected to each other through interconnects, the kinds of measuring instruments, and an environment near each monitoring unit (for example, whether a transformer, a substation, a large-scale power consumption facility, or the like is present nearby, or a distance to the transformer, the substation, or the large-scale power consumption facility) are considered.

In a case in which the training data of each electrical device is generated using data of each electrical device acquired by the monitoring device installed in each monitoring unit and the training data is provided to the plurality of monitoring devices to infer operation states of the electrical devices, it is necessary to consider a variation in the measurement data caused by installation environments of the electrical devices. In a case in which the variation in the measurement data is not considered, a difference can occur between a feature amount of the training data of a first electrical device managed by the server and a feature amount extracted from the measurement data of the first electrical device measured in a certain monitoring unit. As a result, estimation precision of the operation states of the electrical devices in the monitoring unit may deteriorate.

As will be described in detail, the monitoring system according to the present exemplary embodiment is configured such that training data of each of the plurality of electrical devices is generated and managed with the server in consideration of the variation in the measurement data depending on installation environments of the electrical devices.

The monitoring unit may be a unit by which at least one of total current consumption, total power consumption, and a total input voltage can be measured and a determination manner for the monitoring unit is a design factor. For example, an electronic device group (distribution board unit) which is supplied with power from one distribution board may be one monitoring unit. Alternatively, for example, an electrical device group (brand unit of a distribution board) which is supplied with power from one branch of a distribution board, an electrical device group (socket unit) which is supplied with power from one socket, or an electronic device group (table tap unit) which is supplied with power from one table tap can be set as one monitoring unit. In the case of the socket unit and the table tap unit, at least one of the total current consumption, the total power consumption, and the total input voltage can be measured in these units by installing measurement sensors in a socket or a table tap. Additionally, an electronic device group of which a power value or a current value is measured by an electrical power meter (smart meter) that digitally measures power and has a communication function in the meter may be set as one monitoring unit (smart meter unit).

Figure 3:
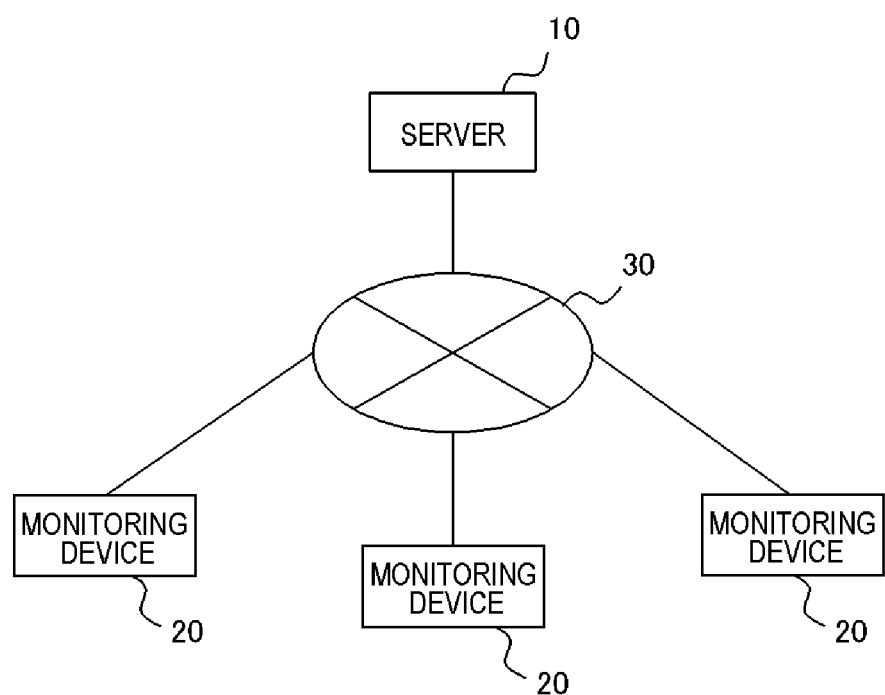
FIG. 3 is an exemplary schematic diagram illustrating an overall monitoring system according to the exemplary embodiment.

Here, a monitoring system in perspective according to the present exemplary embodiment will be described. FIG. 3 illustrates an overall schematic diagram of the monitoring system according to the present exemplary embodiment. As illustrated in FIG. 3, the monitoring system according to the present exemplary embodiment includes a server 10 connected to a network 30 such as the Internet or a LAN and a plurality of monitoring devices 20.

FIG. 23 illustrates an application example of the monitoring system according to the present exemplary embodiment illustrated in FIG. 3. In the case of FIG. 23, a plurality of electrical devices 60 supplied with power through a distribution board 40 are set as one monitoring unit. The monitoring device 20 is installed in the same area as the plurality of electrical devices 60 included in the monitoring unit. The monitoring device 20 is configured to acquire measurement data from a measuring instrument 50 installed in the distribution board 40.

The server 10 manages training data of each of the plurality of electrical devices. The training data includes a feature amount indicated in measurement data when each electrical device is operating. The server 10 transmits the training data of a predetermined electrical device to the monitoring device 20 in response to a request from the monitoring device 20.

FIG. 4 illustrates an example of the training data accumulated in the server 10. In information illustrated in FIG. 4, training data ID for identifying each of a plurality of pieces of training data accumulated in the server 10, an electrical device ID (model number or the like) for identifying each of a plurality of electrical devices, and a feature amount indicated in measurement data at the time of operation of each electrical device are associated with each other.

The feature amount is a feature amount which can be specified using measurement data (waveform data) of at least one among current consumption, an input voltage, and power consumption and may be, for example, a frequency intensity/phase (harmonic component) of current consumption, a phase, a change in current consumption, an average value, a peak value, an effective value, a peak factor, a form factor, a convergence time of a current change, an energization time, the position of a peak, a time difference between a peak position of a voltage and a peak position of current consumption, or a power factor. The training feature amount is not limited to the examples herein.

Referring back to FIG. 3, the monitoring device 20 is installed in each monitoring unit. The monitoring device 20 infers operation states of the electrical devices included in the monitoring unit. Specifically, the monitoring device 20 acquires the training data of each of the electrical devices included in the monitoring unit in which the monitoring device 20 monitors the electrical devices from the server 10 and retains the training data. The monitoring device 20 retains calibration data for calibrating a variation indicated in the measurement data depending on an installation environment of each of the electrical devices for each electrical device. The calibration data is data for calibrating at least one feature amount of a feature amount included in the training data of each of the electrical devices acquired from the server 10 and a feature amount extracted from the measurement data of each of the electrical devices measured under each installation environment in a direction in which a difference of the feature amounts is negated.

When the monitoring device 20 acquires the measurement data (waveform data) including at least one of the total current consumption, the total power consumption, and the total input voltage in a predetermined monitoring unit, the monitoring device 20 infers operation states of the electrical devices using the measurement data, the training data, and the calibration data.

Incidentally, when an electrical device (hereinafter referred to as a new electrical device) is newly added to the monitoring unit and a component of the new electrical device is included in the measurement data, the monitoring device 20 does not retain the training data of the new electrical device, and therefore may not infer the operation states of the electrical devices included in the monitoring unit.

For example, when only electrical devices A to C are simultaneously operating, a feature amount which is a sum of feature amounts of the electrical devices A to C is extracted from the measurement data. Therefore, after calibrating the retained feature amount of each of the electrical devices, by summing the feature amounts in any combination, and comparing the feature amount with the feature amount extracted from the measurement data, which electrical devices are operating can be specified. However, in a case in which a component of a new electrical device of which the training data is not included is included in the electrical devices which are operating, the retained respective feature amounts of the electrical devices do not match the feature amount extracted from the measurement data even when the respective feature amounts are summed in any combination.

When the monitoring device 20 detects a state in which the operation states of the electrical devices may not be inferred, the monitoring device 20 determines that an electrical device (new electrical device) is newly added to the monitoring unit. Incidentally, there is a possibility of the new electrical device newly added to the monitoring unit being a new product newly launched in a market. There is a possibility of training data of the new product not being retained in the server 10. Accordingly, when the monitoring device 20 detects that a new electrical device is added to the monitoring unit, the monitoring device 20 extracts data regarding the new electrical device from the measurement data and transmits the data to the server 10.

For example, the monitoring device 20 acquires the measurement data (waveform data) of the new electrical device by calculating a difference between the pieces of measurement data before and after a time at which the operation state may not be inferred. Then, the monitoring device 20 extracts the feature amount from the measurement data. In this way, the monitoring device 20 can acquire the feature amount of the new electrical device.

Thereafter, the monitoring device 20 generates first calibration data for the new electrical device based on the calibration data of the existing electrical devices included in the monitoring unit. The calibration data generated in this way may not be said to be content in which an installation environment of the new electrical device is completely reflected. However, the installation environments of the electrical devices included in the same monitoring unit are mutually similar or common in some portions. Therefore, based on the calibration data of the existing electrical devices included in the same monitoring unit, it is possible to generate calibration data for the new electrical device with high precision to some extent. When the monitoring device 20 generates the first calibration data for the new electrical device, the monitoring device 20 calibrates the feature amount of the new electrical device using the first calibration data.

The monitoring device 20 receives an input of identification information of the newly added new electrically device from a user. Then, the monitoring device 20 associates the calibrated feature amount of the new electrical device and the identification information of the new electrical device input from the user and transmits the calibrated feature amount and the identification information to the server 10.

The server 10 acquires the calibrated feature amounts of the new electrical devices transmitted in this way from the plurality of monitoring devices 20. Then, the server 10 newly generates the training data of the new electrical device, for example, by executing an averaging process or the like on the plurality of calibrated feature amounts acquired from the plurality of monitoring devices 20 using the acquired calibrated feature amounts. In this way, the pieces of training data of the plurality of electrical devices are accumulated in the server 10.

Next, the configurations of the monitoring device 20 and the server 10 will be described in detail.

Figure 5:
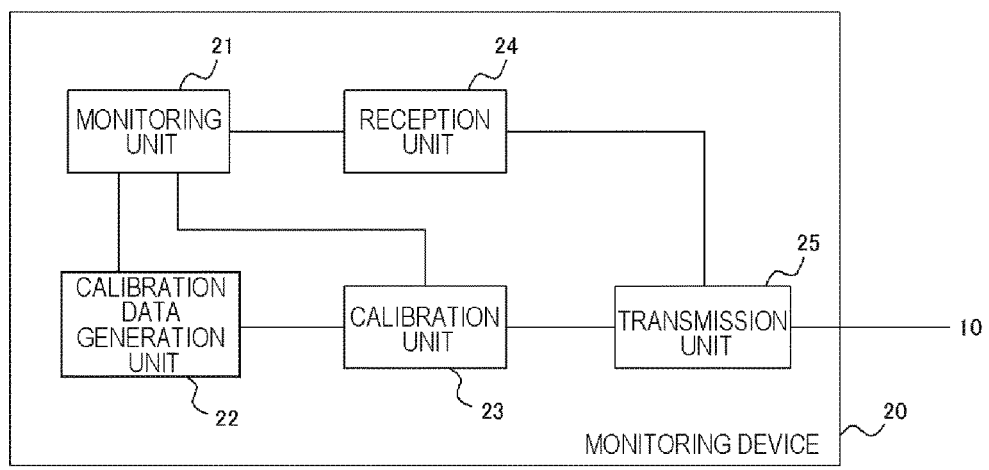
FIG. 5 is an exemplary functional block diagram illustrating a monitoring device 20 according to the exemplary embodiment.

FIG. 5 is an exemplary functional block diagram illustrating the monitoring device 20. As illustrated in FIG. 5, the monitoring device 20 includes a monitoring unit 21, a calibration data generation unit 22, a calibration unit 23, a reception unit 24, and a transmission unit 25. Hereinafter, each unit will be described.

The monitoring unit 21 retains the training data that includes the feature amount at the time of the operation of each of the plurality of electrical devices included in the monitoring unit and the calibration data of each electrical device for calibrating a variation indicated in the measurement data depending on an installation environment of each of the plurality of electrical devices. Hereinafter, the electrical devices for which the monitoring unit 21 retains the training data and the calibration data are referred to as "existing electrical devices".

The monitoring unit 21 acquires at least one piece of measurement data (waveform data) among the total current consumption, the total power consumption, and the total input voltage in the monitoring unit from a measurement device. The measurement device may be installed in a distribution board, a socket, a table tap, or the like. The measurement device may be a so-called smart meter.

Then, the monitoring unit 21 extracts data (new device data) including a component (feature amount) of an electronic device (new electrical device) different from the existing electrical devices among the pieces of measurement data based on a predetermined feature amount extracted from the measurement data, the training data retained in advance, and the calibration data. In the present exemplary embodiment, the new device data is a feature amount at the time of operation of the new device data.

Hereinafter, the process executed by the monitoring unit 21 will be described in detail.

First, FIG. 6 schematically illustrates examples of the training data and the calibration data retained by the monitoring unit 21. In the data illustrated in FIG. 6, a training data ID, an electrical device ID, a device name, a feature amount at the time of operation of the electrical device, and calibration data of the electrical device are associated. The data is generated based on data or the like acquired from the server 10. Hereinafter, an example of a process of generating the data illustrated in FIG. 6 by the monitoring unit 21 will be described. However, the invention is not limited thereto.

For example, when the monitoring device 20 is installed in correspondence with a certain monitoring unit, the monitoring device 20 acquires electrical device IDs (model numbers or the like) of the electrical devices included in the monitoring unit. For example, the monitoring device 20 may receive inputs of the electrical device IDs from a user. Additionally, when wireless and/or wired communication is possible between the monitoring device 20 and the electrical devices, the monitoring device 20 may acquire the electrical device ID from each electrical device through the communication.

When the monitoring device 20 acquires the electrical device ID, the monitoring device 20 transmits a request for the training data together with the acquired electrical device ID to the server 10. The server 10 searches a storage device of the server 10 in response to the request (see FIG. 4). Then, the server 10 extracts the training data associated with the electrical device ID included in the request and sends back the training data to the monitoring device 20. The monitoring unit 21 stores the pieces of training data of the plurality of electrical device acquired in this way.

Next, the monitoring unit 21 generates the calibration data for each electric device using the acquired training data. For example, the monitoring unit 21 acquires the measurement data of each electrical device obtained when the user individually operates the electrical device. Then, the monitoring unit 21 extracts the feature amount from the measurement data. Thereafter, the monitoring unit 21 generates calibration data to negate a difference between the feature amount of the first electrical device included in the training data and the feature amount of the first electrical device obtained from the measurement data according to an algorithm determined in advance. The calibration data may be a function. For example, the calibration data may be a linear function or a quadratic or more function of multiplying one of the feature amounts by a predetermined coefficient. The calibration data may be an inversely transformable function.

The monitoring unit 21 can receive a name for identifying each electrical device from the user for each electrical device. The name is used, for example, when the user is notified of operation state of each electrical device. Based on information obtained in this way, the monitoring unit 21 generates and manages the data illustrated in FIG. 6.

Next, an example of a process in which the monitoring unit 21 extracts the data (the new device data) including the component (the feature amount) of the new electrical device from the measurement data will be described.

For example, the monitoring unit 21 can infer the operation states of the plurality of exiting electrical devices included in the monitoring unit based on the training data illustrated in FIG. 6 and the measurement data (the waveform data) acquired from the measurement device. For example, the monitoring unit 21 extracts a predetermined feature amount from the measurement data. The feature amount is a feature amount at the time of operation of one electrical device which is operating at that time or a feature amount in which feature amounts at the time of operation of the plurality of respective electrical devices which are operating at that time are summed.

The monitoring unit 21 obtains a calibrated feature amount obtained by calibrating the feature amount of each electrical device included in the training data using the calibration data of each electrical device. The monitoring unit 21 may calculate the calibrated feature amount of each electrical device in advance and retain the calibrated feature amount. Then, the monitoring unit 21 obtains a feature amount in which the calibrated feature amounts are summed in any combination of the electrical devices. The monitoring unit 21 may retain the summed feature amount in advance.

FIG. 7 illustrates an example of the summed feature amount. In the data illustrated in FIG. 7, the sum training data ID for identifying each piece of sum training data generated by summing the pieces of training data of the respective electrical devices, two or more training data IDs which are bases of the sum training data, and the feature amount in which the calibrated feature amounts are summed are associated.

The monitoring unit 21 collates the feature amount extracted from the measurement data with the feature amount included in the training data (including the calibrated training data of each electrical device and the sum training data) and specifies the matched training data. For example, the monitoring unit 21 inputs the feature amount extracted from the measurement data to an estimation model generated using the training data (including the calibrated training data of each electrical device and the sum training data) and obtains an ID of the matched training data (including the calibrated training data of each electrical device and the sum training data) as an estimation result (collation result). The estimation model can be executed using, for example, multiple regression analysis, neural network, or a support vector machine.

Figure 9:
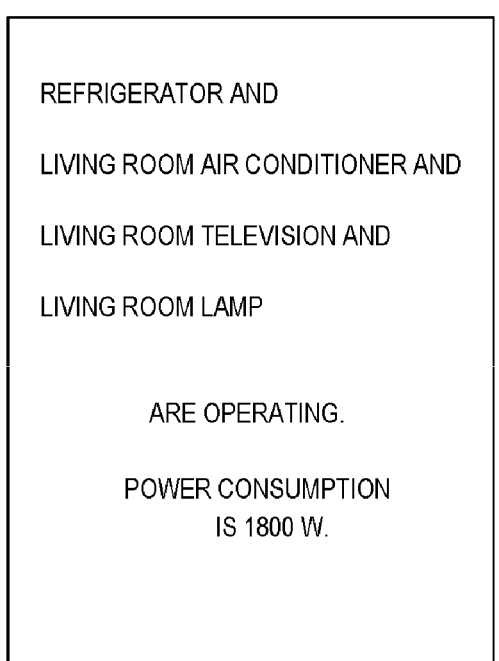
FIG. 9 is a diagram illustrating an example of information output by the monitoring device 20 according to the exemplary embodiment.

As a result, the monitoring unit 21 can specify the electrical devices which are operating at that time. Then, the monitoring device 20 can output, for example, information illustrated in FIG. 9. In FIG. 9, device names of the electrical devices which are operating (see FIG. 6) and total power consumption are displayed.

Incidentally, when an electrical device (new electrical device) is newly added to the monitoring unit, a component of the new electrical device can be included in the measurement data. However, the monitoring unit 21 does not retain the training data of the new electrical device. Therefore, in a case in which the component of the new electrical device is included in the measurement data, the monitoring unit 21 may not infer the operation states of the electrical devices included in the monitoring unit. That is, the monitoring unit 21 obtains a result indicating that the matched training data (including the calibrated training data of each electrical device and the sum training data) is not present.

When the monitoring unit 21 detects a state in which the operation states of the electrical devices may not be inferred, the monitoring unit 21 determines that the new electrical device is added to the monitoring unit. For example, the monitoring unit 21 may determine that the new electrical device is added to the monitoring unit in a case in which an estimation result obtained by inputting the feature amount extracted from the measurement data to the estimation model mentioned above indicates that the matched training data (including the calibration training data of each electrical device and the sum training data) is not present. The monitoring unit 21 may calculate the number of detections of the state in which the operation states of the electrical devices may not be inferred, a detection frequency, or the like, and determine that the new electrical device is added to the monitoring unit when the value exceeds a predetermined threshold.

After the monitoring unit 21 determines that the new electrical device is added to the monitoring unit, the monitoring unit 21 can obtain the measurement data (the waveform data) of the new electrical device, for example, by specifying a boundary between a state where the operation states of the electrical devices had been able to be inferred and a changed state where the operation states of the electrical devices could no longer be inferred, and calculating a difference between the pieces of measurement data (the measurement data in the state in which the operation states of the electrical devices can be inferred and the measurement data in the state in which the operation states of the electrical devices may not be inferred) before and after the boundary. Then, the monitoring unit 21 can obtain the new device data including the feature amount of the new electrical device by extracting the predetermined feature amount from the measurement data (the waveform data).

Referring back to FIG. 5, when the monitoring unit 21 extracts the new device data, the calibration data generation unit 22 accordingly generates the first calibration data of the new electrical device based on the calibration data of the existing electrical devices. For example, the calibration data generation unit 22 may determine a predetermined one piece of calibration data among the pieces of calibration data of the plurality of existing electrical devices as the first calibration data of the new electrical device. Additionally, the calibration data generation unit 22 may determine the calibration data obtained by averaging some or all of the pieces of calibration data of the plurality of existing electrical devices as the first calibration data of the new electrical device.

Here, an example of a process in which the calibration data generation unit 22 determines a predetermined one piece of calibration data among the pieces of calibration data of the plurality of existing electrical devices as the first calibration data of the new electrical device will be described.

For example, the calibration data generation unit 22 may realize the following processes (1) to (4) of:

(1) obtaining a maximum value of an instantaneous waveform of a current;

(2) normalizing the instantaneous waveform of the current with a maximum value of an instantaneous waveform of the current;

(3) comparing the normalized instantaneous waveform of the current with an instantaneous waveform of each of the existing electrical device retained in advance by an error function; and (4) selecting a calibration function of the existing electrical devices in which a value of the error function is the smallest.

Figure 8:
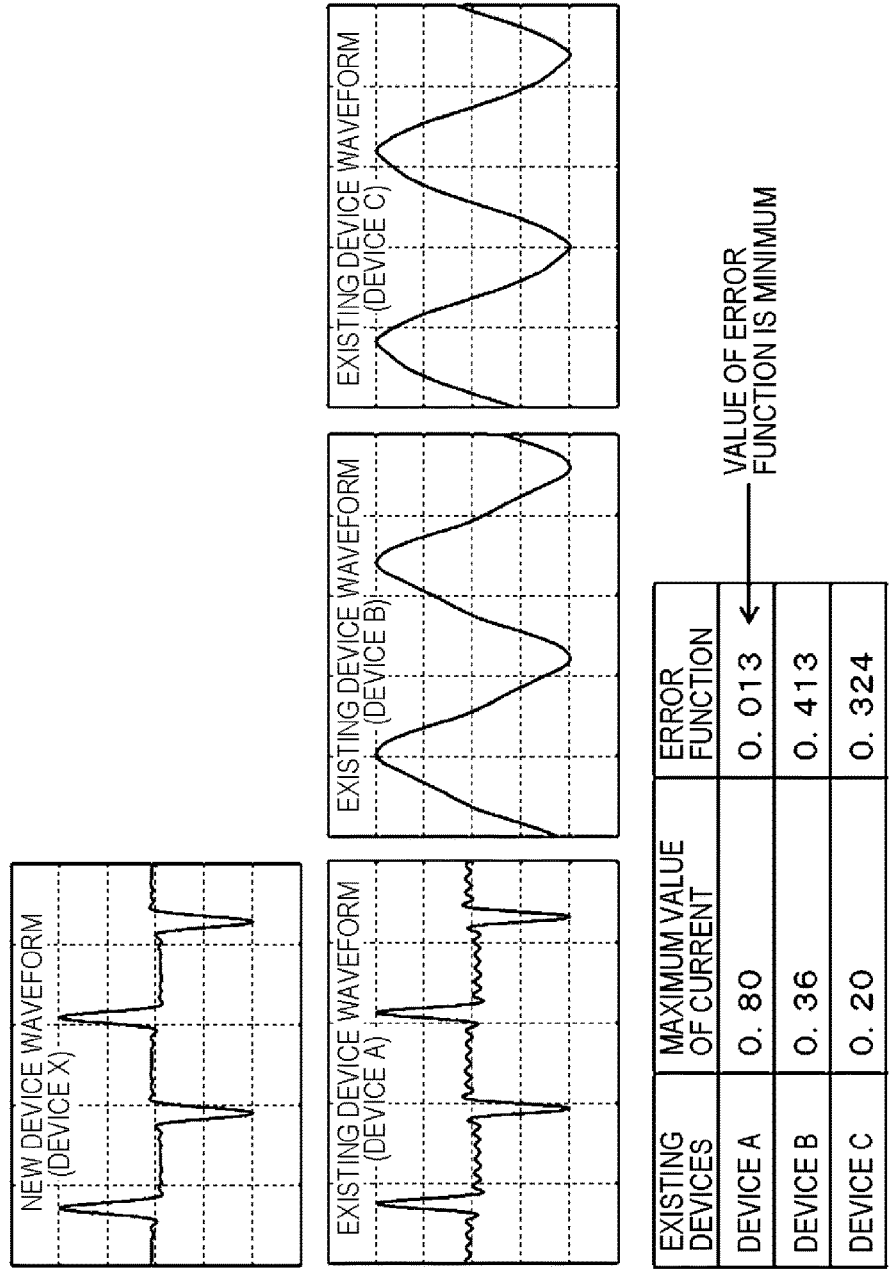
FIG. 8 is a diagram illustrating an example of a process of generating first calibration data.

A specific example is illustrated in FIG. 8. A device X is a new electrical device and devices A to C are existing electrical devices. In the case of the example illustrated in FIG. 8, the device A is selected through the processes (1) to (4). The calibration data of the device A is determined as the first calibration data of the device X. The error function is, for example, an average value of absolute differences or an average value of sums of squared differences. The error function may be another value such as an average value of absolute values of N-th powers.

Referring back to FIG. 5, the calibration unit 23 calibrates the new device data (the feature amount) extracted by the monitoring unit 21 based on the first calibration data generated by the calibration data generation unit 22. That is, the calibration unit 23 calibrates the feature amount (the new device data) extracted from the measurement data measured in the monitoring unit into a feature amount for the server. In the case in which the calibration data is an inversely transformable function, the feature amount managed by the server can be calibrated to a feature amount for a predetermined monitoring unit (for a predetermined installation environment) and the feature amount extracted from the measurement data measured in predetermined monitoring unit (predetermined installation environment) can also be calibrated to a feature amount for the server. For example, in a case in which the calibration data is a linear function of calibrating the feature amount to a feature amount for each installation environment by multiplying the feature amount of the training data by a predetermined coefficient, the feature amount can be calibrated to a feature amount for the server (for the training data) by multiplying the feature amount extracted from the measurement data measured in a predetermined installation environment by a reciprocal of the coefficient.

When the monitoring unit 21 extracts the new device data, the reception unit 24 accordingly receives an input of the identification information (electrical device ID) of the new electrical device. A unit receiving the input is not particularly limited. For example, the reception unit 24 may output information such as "Please input model number of newly installed electrical device" through a display included in the monitoring device 20 or a display connected to the monitoring device 20 and may prompt the user to input the electrical device ID of the new electrical device. An input of predetermined information may be received from the user through a touch panel display or an input device such as an operation button included in the monitoring device 20. Additionally, when wireless and/or wired communication between the monitoring device 20 and the electrical device is possible, the monitoring device 20 may acquire the electrical device ID from each electrical device through the communication and manages the electrical device ID. When a new electrical device ID which does not corresponds to the managed electrical device ID is acquired, the new electrical device ID may be recognized as the electrical device ID of the new electrical device.

The transmission unit 25 associates the identification information (the electrical device ID) of the new electrical device of which the input is received by the reception unit 24 with the new device data (the feature data) calibrated based on the first calibration data and transmits the identification information and the new device data to the server 10.

Figure 10:
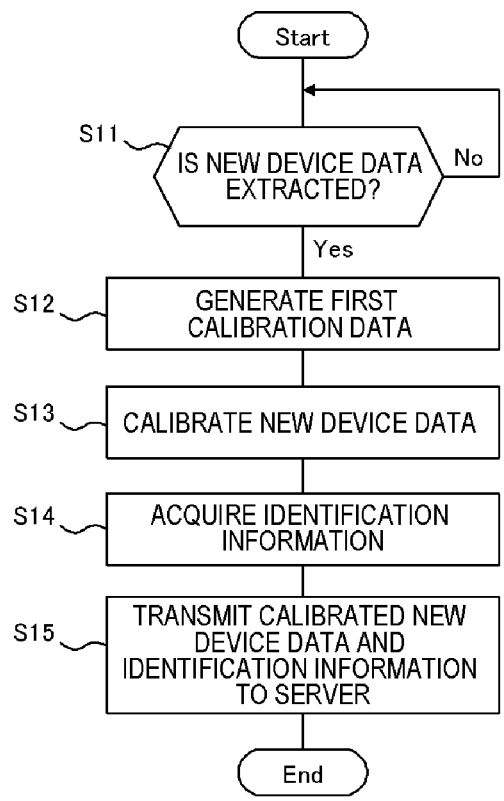
FIG. 10 is a flowchart illustrating an example of the flow of a process of the monitoring device 20 according to the exemplary embodiment.

FIG. 10 is a flowchart illustrating an example of the flow of a process of the monitoring device 20 according to the present exemplary embodiment.

When the monitoring unit 21 extracts the new device data (the feature amount of the electrical device newly installed in the monitoring unit) (Yes of S11), a subsequent process starts. While the monitoring unit 21 does not extract the new device data (No of S11), the monitoring device 20 enters a standby state.

When the monitoring unit 21 extracts the new device data (Yes of S11), the calibration data generation unit 22 generates the first calibration data (S12). Then, the calibration unit 23 calibrates the new device data extracted in S11 using the first calibration data generated in S12 (S13).

The reception unit 24 receives an input of the identification information (the electrical device ID) of the new electrical device (S14). The order of the processes of S12 and S13 and the process of S14 may be reversed.

Thereafter, the transmission unit 25 associates the calibrated new device data calibrated in S13 with the identification information (the electrical device ID) of the new electrical device received in S14 and transmits the calibrated new electrical device data and the identification information to the server 10 (S15).

Figure 11:
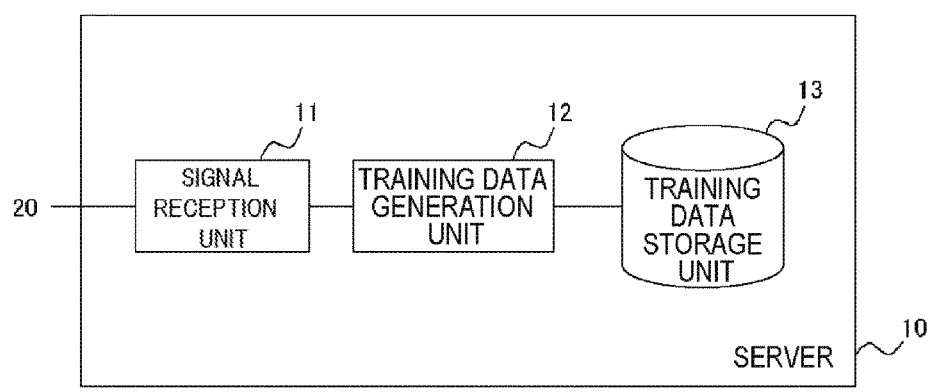
FIG. 11 is an exemplary functional block diagram illustrating a server 10 according to the exemplary embodiment.

Next, the server 10 will be described. FIG. 11 illustrates an example of a functional block diagram of the server 10. As illustrated in FIG. 11, the server 10 includes a signal reception unit 11, a training data generation unit 12, and a training data storage unit 13.

The signal reception unit 11 receives the calibrated new device data (the feature amount) of the new electrical device and the identification information (the electrical device ID) from the plurality of monitoring devices 20.

The training data generation unit 12 generates the training data of the new electrical device based on the calibrated new device data (the feature amount) of the new electrical device received from each of the plurality of monitoring devices 20 and registers the training data in the training data storage unit 13.

For example, the training data generation unit 12 groups pieces of calibrated new device data (the feature amount) of the new electrical devices received from the plurality of monitoring devices 20 according to the electrical device ID. Then, a predetermined statistical process is executed on the plurality of pieces of calibrated new device data (the feature amounts) for each group to determine a representative value (feature amount). For example, the training data generation unit 12 may set some or all of the plurality of pieces of calibrated new device data (the feature amounts) as processing targets and calculate an average value, a mode value, a median value, a maximum value, a minimum value, or the like as the representative value.

The training data generation unit 12 generates training data associating the representative value of each group determined in this way with the electrical device ID of each group and registers the training data in the training data storage unit 13 (see FIG. 4).

Figure 12:
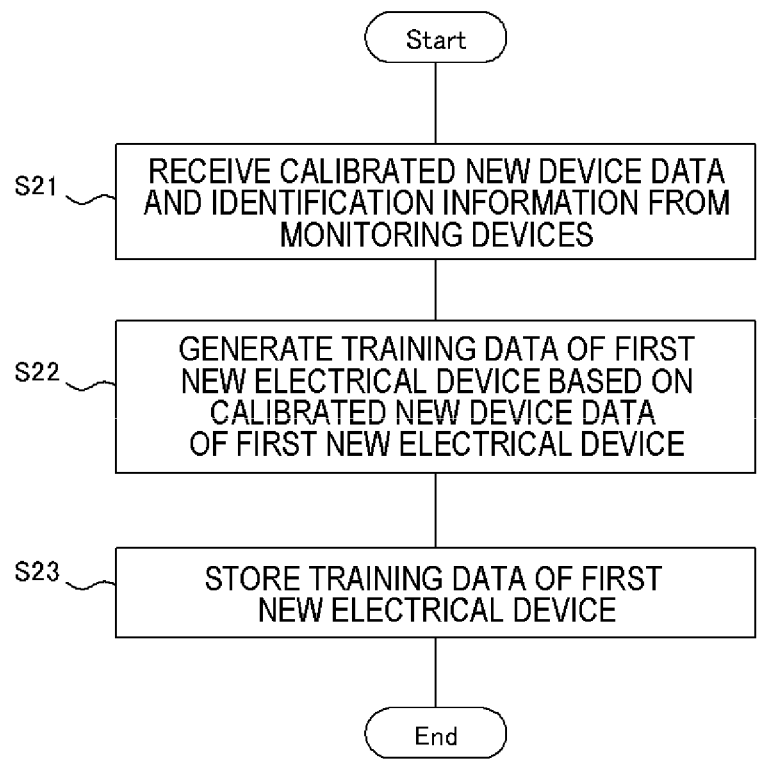
FIG. 12 is a flowchart illustrating an example of the flow of a process of the server 10 according to the exemplary embodiment.

FIG. 12 is a flowchart illustrating an example of the flow of a process of the server 10 according to the present exemplary embodiment.

First, the signal reception unit 11 receives the calibrated new device data (the feature amount) and the identification information (the electrical device ID) of the new electrical device from the plurality of monitoring devices 20 (S21). Pieces of received data are grouped and accumulated, for example, according to the electrical device ID.

Next, the calibration data generation unit 22 generates the training data of the new electrical device based on the calibrated new device data (the feature amount) of the new electrical device received from each of the plurality of monitoring devices 20 (S22). For example, among the groups described above, the calibration data generation unit 22 sets a group in which the number of pieces of accumulated data exceeds a predetermined number as a processing target. Then, the calibration data generation unit 22 sets some or all of the feature amounts of a predetermined number or more included in the processing target group as processing targets and calculates a statistical value (for example, an average value, a mode value, a median value, a maximum value, or a minimum value) thereof as a representative value. Then, the calibration data generation unit 22 generates the training data in which the representative value of each group determined in this way is associated with the electrical device ID of each group.

Thereafter, the calibration data generation unit 22 registers the training data generated in S22, in the training data storage unit 13 (S23).

According to the above-described present exemplary embodiment, the server 10 can collect data used to generate the training data from the plurality of monitoring devices 20. Then, the server 10 can generate predetermined training data based on the collected data. In this way, according to the present exemplary embodiment, a new technology for managing the training data including the feature amount of each of the plurality of electrical devices with the server is realized.

In the present exemplary embodiment, the server 10 can acquire the data (the feature amounts) calibrated with the predetermined calibration data (the first calibration data) from each monitoring device 20. That is, the server 10 acquires, from each monitoring device 20 having the electrical device group under an installation environment different from each other as a monitoring target, not the feature amount of the new electrical device obtained under each installation environment, but the feature amount calibrated into a value in a case in which the feature amount is measured under a predetermined standard installation environment. Then, the server 10 generates the training data of each electrical device based on the calibrated feature amount. Therefore, according to the present exemplary embodiment, it is possible to generate the training data including the feature amount in the case in which the feature amount is measured under the predetermined standard installation environment.

"First Modification Example"

Figure 15:
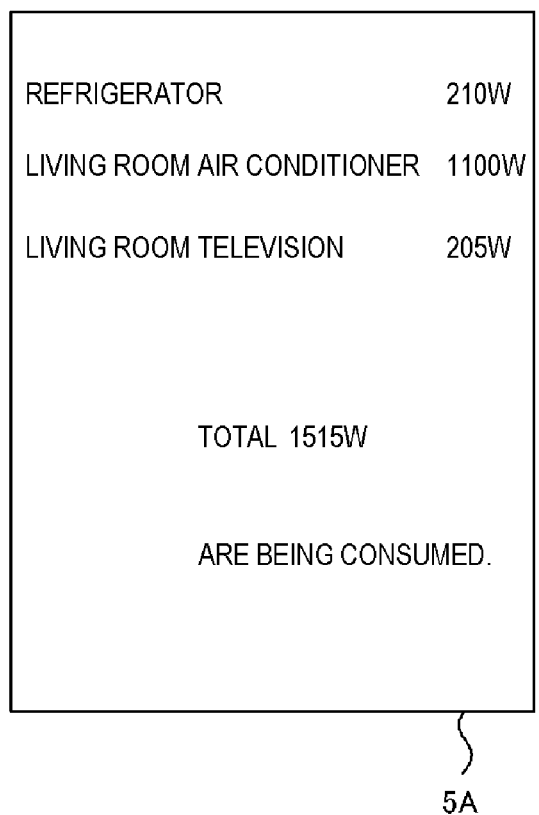
FIG. 15 is a diagram illustrating an example information of output by the monitoring device 20 according to the exemplary embodiment.

In the above-described exemplary embodiment, one piece of training data including the feature amount at the time of the operation of each electrical device corresponds to each electrical device. In the modification example, the plurality of pieces of training data including the feature amount corresponding to each of a plurality of possible states of each electrical device may be associated with each electrical device. FIG. 13 illustrates training data according to the modification example retained by the monitoring unit 21. A training data ID, an electrical device ID, a device name, and calibration data are the same as those of the example illustrated in FIG. 6. In this example, a power value band which can be consumed by each electrical device is divided into a plurality of groups at a predetermined power vale width. Then, a representative value (for example, a median value) and a feature amount are associated with each group. In the field of illustrated "power consumption", a representative value of each group (each state) is stated. FIG. 14 illustrates the sum training data generated based on such training data. In the case of the modification example, the monitoring unit 21 can specify the electrical devices which are operating and can also specify the power consumptions of the electrical devices, as operation states of the electrical devices of the monitoring unit. As a result, for example, information illustrated in FIG. 15 can be supplied to the user.

In the case of this modification example, when the measurement data (waveform data) of the new electrical device is obtained in accordance with the above-described method, the monitoring unit 21 extracts the feature amount of the new electrical device based on the measurement data and calculates a power value consumed by the new electrical device. The transmission unit 25 associates the identification information (the electrical device ID) of the new electrical device, the new device data (the feature amount) calibrated based on the first calibration data, and the power consumption value calculated by the monitoring unit 21 with each other and transmits the identification information, the new device data, and the power consumption value to the server 10. The server 10 groups pieces of new device data (the feature amount) into groups, the pieces of data in each group having the same electrical device ID and having a power consumption value included in the same power value band (for example, any of a plurality of power value bands set at a width of 0 W to 5 W), and generates the training data. Even in the modification example, the same operational effects are achieved. The modification example can be applied to all of the following exemplary embodiments.

"Second Modification Example"

In the foregoing exemplary embodiment, the monitoring device 20 executes all of "the process of extracting the feature amount from the measurement data (the waveform data) of the new electrical device and generating the new device data", "the process of generating the first calibration data based on the calibration data of the existing electrical device", and "the process of correcting the new device data (the feature amount) based on the first calibration data". However, some or all of the processes may be executed by the server 10.

For example, the server 10 may receive the measurement data (the waveform data) of the new electrical device from the monitoring device 20. Then, the server 10 may extract a predetermined feature amount from the received measurement data (the waveform data) of the new electrical device. The measurement data (the waveform data) of the new electrical device may be compressed through a predetermined compression process and may subsequently be transmitted from the monitoring device 20 to the server 10.

The server 10 may store the calibration data of the existing electrical device retained by each monitoring device 20 in advance for each monitoring device 20. Then, the first calibration data may be generated based on the calibration data.

The server 10 may receive the first calibration data generated by the monitoring device 20 from the monitoring device 20.

The server 10 may calibrate the new device data (the feature amount) extracted from the measurement data (the waveform data) of the new electrical device received from the monitoring device 20 or the new device data (the feature amount) received from the monitoring device 20 based on the first calibration data generated by the server 10 or the first calibration data received from the monitoring device 20. The modification example can be applied to all of the following exemplary embodiments.

In a case in which the measurement data (the waveform data) of the new electrical device is transmitted from the monitoring device 20 to the server 10 by applying the second modification example, the server 10 may execute the process of specifying each of the plurality of possible states of each electrical device described in the first modification example, that is, the process of calculating the power consumption value from the waveform data.

<Second Exemplary Embodiment>

First, an overview of the present exemplary embodiment will be described. In the present exemplary embodiment, after the server 10 generates the training data in accordance with the method described in the first exemplary embodiment, the training data generated by the server 10 is sent back to the monitoring device 20. Then, the monitoring device 20 stores the received training data and generates calibration data of the new electrical device based on the training data. Thereafter, the monitoring device 20 may calibrate the feature amount included in the received training data based on the generated calibration data and store the feature amount. The monitoring device 20 may generate and store the sum training data (see FIGS. 7, 14, and the like) using the calibrated training data. Thereafter, the monitoring device 20 infers the operation states of the plurality of electrical devices (including the existing electrical devices and the new electrical device) and extracts the new device data using the training data, the calibration data, the calibrated training data, the sum training data, and the like. Hereinafter, the detailed description will be made.

Figure 16:
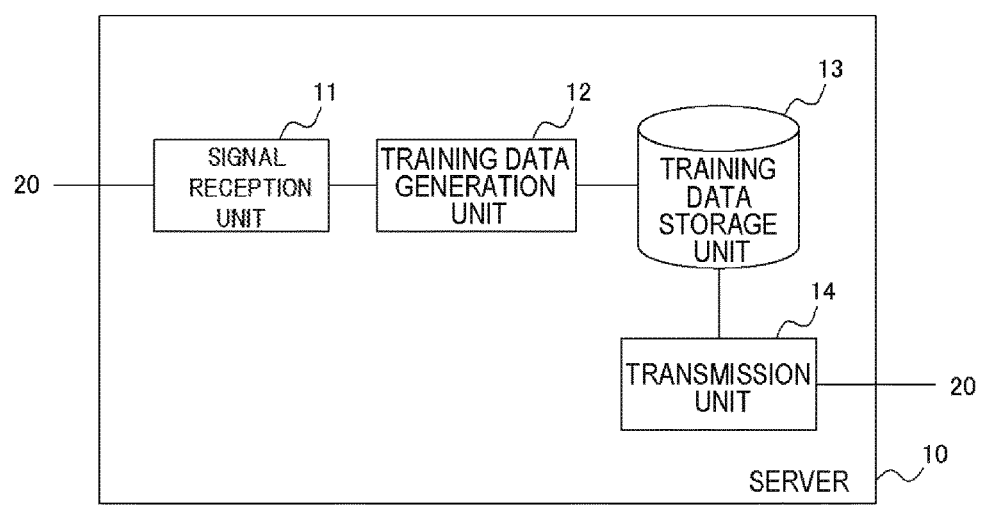
FIG. 16 is an exemplary functional block diagram illustrating the server 10 according to the exemplary embodiment.

FIG. 16 is an exemplary functional block diagram illustrating the server 10. As illustrated in FIG. 16, the server 10 includes a signal reception unit 11, a training data generation unit 12, a training data storage unit 13, and a transmission unit 14. The configurations of the signal reception unit 11, the training data generation unit 12, and the training data storage unit 13 are the same as those of the first exemplary embodiment, and the description thereof will not be repeated herein.

The transmission unit 14 transmits the training data generated by the training data generation unit 12 and newly registered in the training data storage unit 13 to the monitoring device 20. For example, the transmission unit 14 sends back the training data to the monitoring device 20 transmitting the identification information (the electrical device ID) of the new electrical device and the calibrated new device data (the feature amount) in association therewith to the server 10.

As described in the modification examples of the first exemplary embodiment, in a case in which the training data generation unit 12 generates the plurality of pieces of training data corresponding to the plurality of states for each new electrical device, the pieces of training data of respective states are sequentially generated without being simultaneously generated in the other case. In either case, the transmission unit 14 transmits the pieces of generated training data of all the plurality of states to the monitoring device 20. In the latter case, the transmission unit 14 may transmit (send back) the training data to the monitoring device 20 whenever the training data corresponding to a new state is generated.

Figure 17:
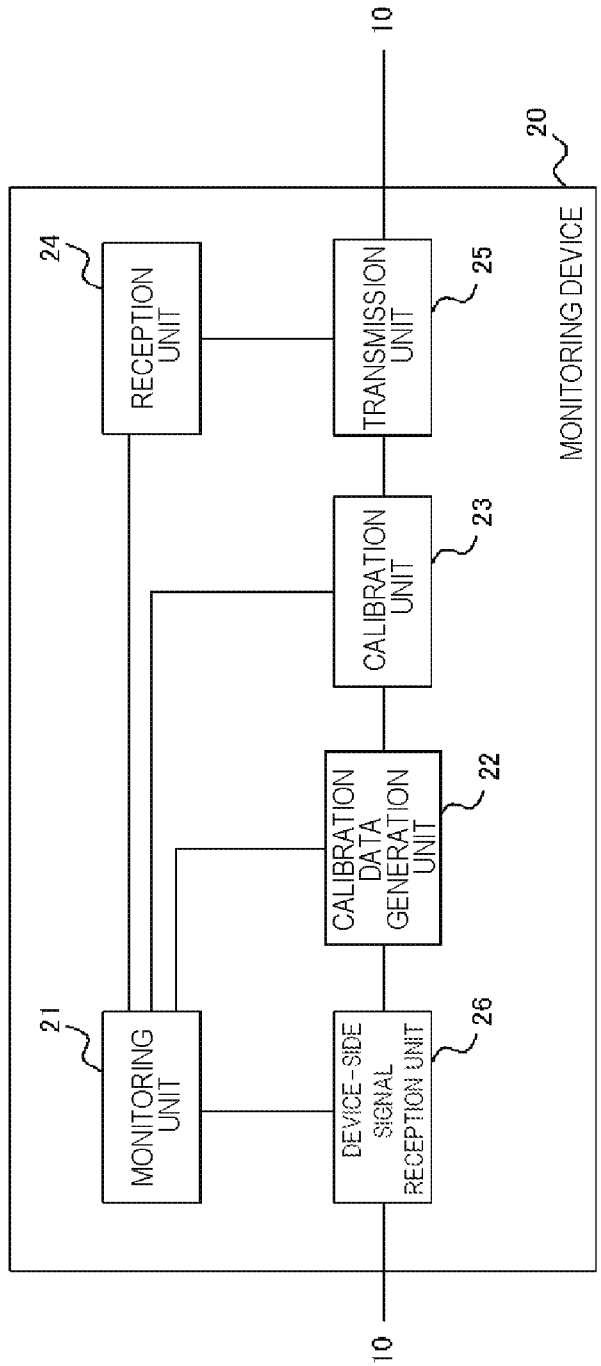
FIG. 17 is an exemplary functional block diagram of the monitoring device 20 according to the exemplary embodiment.

FIG. 17 is an exemplary functional block diagram illustrating the monitoring device 20. As illustrated in FIG. 17, the monitoring device 20 includes a monitoring unit 21, a calibration data generation unit 22, a calibration unit 23, a reception unit 24, a transmission unit 25, and a device-side signal reception unit 26. The configurations of the monitoring unit 21, the calibration unit 23, the reception unit 24, and the transmission unit 25 are the same as those of the first exemplary embodiment, and the description thereof will not be repeated herein.

The device-side signal reception unit 26 receives the training data of the new electrical device transmitted by the transmission unit 14 of the server 10. The received training data is input to the monitoring unit 21 and the calibration data generation unit 22.

The calibration data generation unit 22 generates the calibration data of the new electrical device based on the training data of the new electrical device input from the device-side signal reception unit 26 and the new device data (the feature amount) of the new electrical device extracted by the monitoring unit 21. For example, the calibration data generation unit 22 generates calibration data to negate a difference between the feature amount of the new electrical device included in the training data and the feature amount of the new electrical device extracted by the monitoring unit 21 according to an algorithm determined in advance. The calibration data may be a function. For example, the calibration data may be a linear function or a quadratic or more function of multiplying one of the feature amounts by a predetermined coefficient. The calibration data may be an inversely transformable function. The calibration data generated in this way is input to the monitoring unit 21.

As described in the modification example of the first exemplary embodiment, the device-side signal reception unit 26 receives the plurality of pieces of training data corresponding to the plurality of states in a case in which the training data generation unit 12 generates the plurality of pieces of training data corresponding to the plurality of states for each new electrical device. In this case, the calibration data generation unit 22 may generate the calibration data using the training data corresponding to the state in which the feature amount is extracted as the new device data by the monitoring unit 21 among the plurality of pieces of received training data corresponding to the plurality of states.

Figure 18:
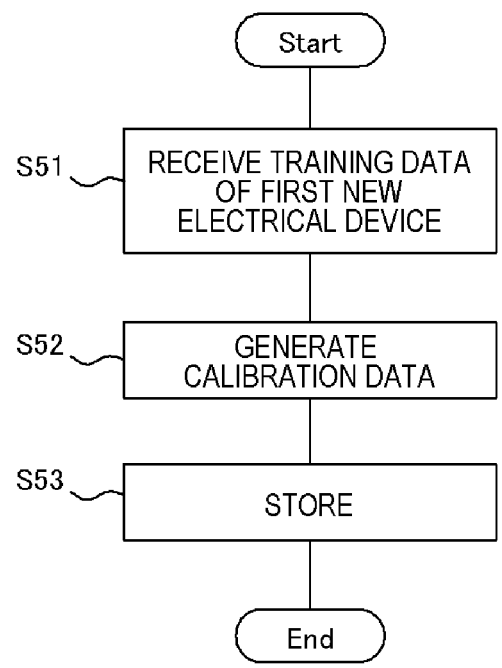
FIG. 18 is a flowchart illustrating an example of the flow of a process of the monitoring device 20 according to the exemplary embodiment.

FIG. 18 is a flowchart illustrating an example of the flow of a process of the monitoring device 20 according to the present exemplary embodiment.

At a predetermined timing after the transmission unit 25 transmits the calibrated new device data (the feature amount) and the identification information (the electrical device ID) of the new electrical device to the server 10, the device-side signal reception unit 26 receives the training data of the new electrical device (S51).

Then, the calibration data generation unit 22 generates the calibration data based on the new device data (the feature amount) of the new electrical device extracted by the monitoring unit 21 and the feature amount of the new electrical device included in the training data received in S51 (S52).

Then, the training data received in S51 and the calibration data generated in S52 are associated to be stored (S53). Thereafter, the monitoring unit 21 infers the operation states of the plurality of electrical devices (including the existing electrical devices and the new electrical device) using the training data, the calibration data, and the like.

According to the above-described present exemplary embodiment, it is possible to obtain the same operational effects as those of the first exemplary embodiment. Further, each monitoring device 20 can receive the training data from the server 10 and infer the operation states of the plurality of electrical devices (including the existing electrical devices and the new electrical device) included in the monitoring unit.

<Third Exemplary Embodiment>

First, an overview of the present exemplary embodiment will be described. In the present exemplary embodiment, training data generated by the server 10 in accordance with the method described in the first exemplary embodiment is sent back as tentative training data to the monitoring device 20. The monitoring device 20 generates tentative calibration data based on the received tentative training data of the new electrical device and a feature amount (new device data) of the new electrical device extracted by the monitoring unit 21. Then, the monitoring device 20 calibrates the new device data extracted by the monitoring unit 21 to the tentative calibration data and transmits the calibrated new device data to the server 10. The server 10 generates the tentative training data in accordance with the same method as the method described in the first exemplary embodiment based on the received and calibrated new device data. Then, the server 10 sends back the generated tentative training data to the monitoring device 20 again.

In the present exemplary embodiment, the tentative training data obtained after repeating the foregoing processes a predetermined number of times is registered as training data of the new electrical device in the training data storage unit 13. Thereafter, the processes of the second exemplary embodiment can be executed based on the training data of the new electrical device registered in the training data storage unit 13 in this way. Hereinafter, the detailed description will be made.

Figure 19:
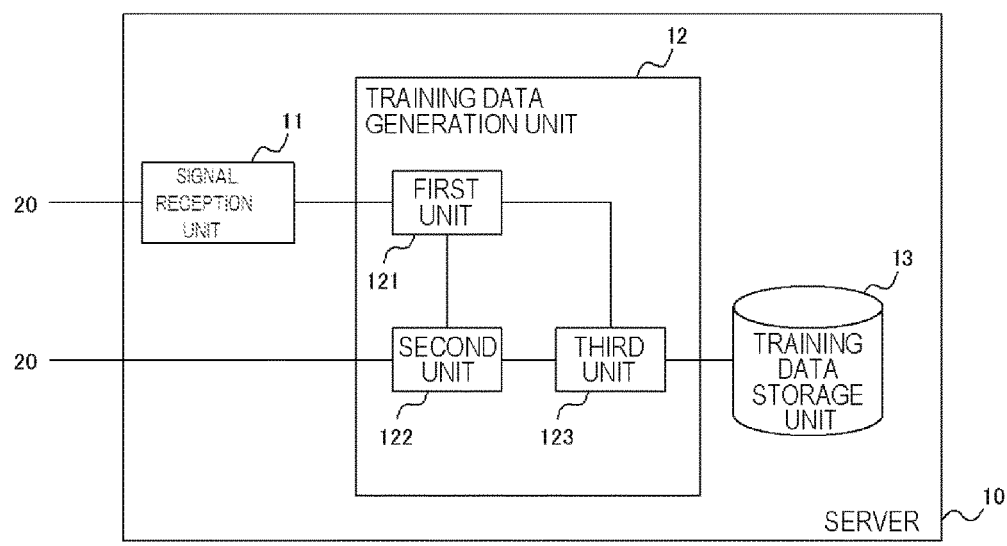
FIG. 19 is an exemplary functional block diagram illustrating the server 10 according to the exemplary embodiment.

FIG. 19 is an exemplary functional block diagram illustrating the server 10. As illustrated in FIG. 19, the server 10 includes a signal reception unit 11, a training data generation unit 12, and a training data storage unit 13. The training data generation unit 12 includes a first unit 121, a second unit 122, and a third unit 123. The server 10 may further include a transmission unit 14. The configurations of the training data storage unit 13 and the transmission unit 14 are the same as those of the first and second exemplary embodiments, and the description thereof will not be repeated herein.

The first unit 121 generates the tentative training data including a tentative feature amount of the new electrical device based on the calibrated new device data of the new electrical device received from each of the plurality of monitoring devices 20. The first unit 121 generates the training data of the new electrical device in accordance with the same method as the method in which the training data generation unit 12 described in the first exemplary embodiments generates the training data of the new electrical device. Then, the training data is set as the tentative training data.

The second unit 122 transmits the tentative training data generated by the first unit 121 to the monitoring device 20. For example, the second unit 122 sends back the tentative training data to the monitoring device 20 transmitting the identification information (the electrical device ID) of the new electrical device and the calibrated new device data (the feature amount) in association therewith to the server 10.

The third unit 123 will be described below.

FIG. 17 is an exemplary functional block diagram illustrating the monitoring device 20. As illustrated in FIG. 17, the monitoring device 20 includes a monitoring unit 21, a calibration data generation unit 22, a calibration unit 23, a reception unit 24, a transmission unit 25, and a device-side signal reception unit 26. The configurations of the monitoring unit 21 and the reception unit 24 are the same as those of the first and second exemplary embodiments, and the description thereof will not be repeated herein.

The device-side signal reception unit 26 receives the tentative training data transmitted by the second unit 122 of the server 10.

The calibration data generation unit 22 generates second calibration data to negate a difference between the tentative feature amount included in the tentative training data received by the device-side signal reception unit 26 and the new device data (the feature amount) extracted by the monitoring unit 21 based on the tentative feature amount and the new device data. The method of generating the calibration data is the same as the method of the above-described example, and the description thereof will not be repeated herein.

The calibration unit 23 calibrates the new device data extracted by the monitoring unit 21 based on the second calibration data generated by the calibration data generation unit 22.

The transmission unit 25 associates the identification information (the electrical device ID) of the new electrical device with the new device data (the feature amount) calibrated based on the second calibration data and transmits the identification information and the new device data to the server.

Referring back to FIG. 19, the signal reception unit 11 of the server 10 receives the identification information (the electrical device ID) of the new electrical device and the new device data (the feature amount) calibrated based on the second calibration data from the plurality of monitoring devices 20.

The first unit 121 generates the tentative training data including the tentative feature amount again based on the new device data (the feature amount) calibrated based on the second calibration data received from the plurality of monitoring devices 20. The method of generating the tentative training data is the same as the method of the above-described example, and the description thereof will not be repeated herein.

The second unit 122 transmits the tentative training data generated by the first unit 121 to the monitoring device 20 again. Then, the device-side signal reception unit 26, the calibration data generation unit 22, the calibration unit 23, and the transmission unit 25 of the monitoring device 20 repeat the same processes as the foregoing processes.

The third unit 123 illustrated in FIG. 19 controls the first unit 121 and the second unit 122 such that these units repeat the process of generating the tentative training data and the process of transmitting the tentative training data to the monitoring device. Then, the third unit 123 determines the tentative training data of the new electrical device obtained after the processes are repeated by the first unit 121 and the second unit 122 as training data of the new electrical device and registers the training data in the training data storage unit 13.

For example, the third unit 123 may repeat the foregoing processes until a change amount (for example, a difference from the immediately previous tentative feature amount) of the tentative feature amount falls within a predetermined threshold. The processes may be repeated a number of times determined in advance. The processes may be repeated during a period determined in advance.

Figure 20:
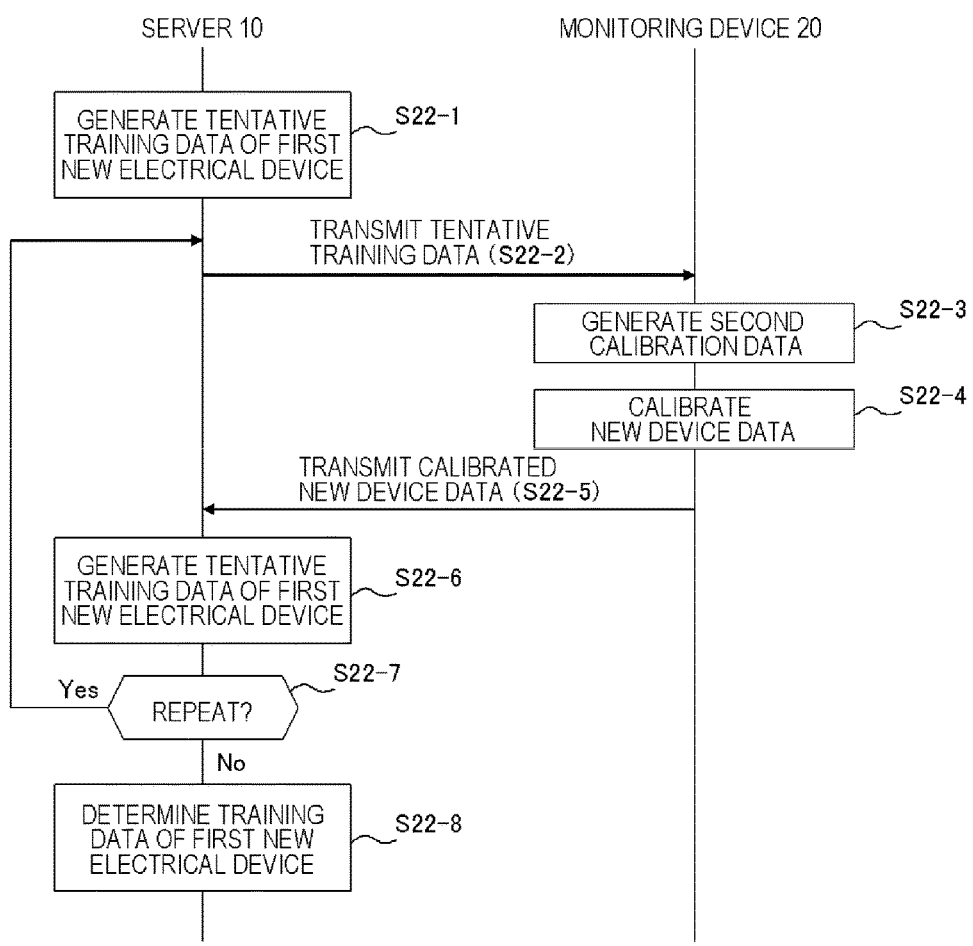
FIG. 20 is a sequence diagram illustrating an example of the flow of a process of a monitoring system according to the exemplary embodiment.

FIG. 20 is a sequence diagram illustrating an example of the flow of the processes of the server 10 and the monitoring device 20 according to the present exemplary embodiment. Processes of S22-1 to S22-8 are executed at the time of the process of S22 of FIG. 12.

When the server 10 receives the new device data (the feature amount) calibrated based on the first calibration data (described in the first exemplary embodiment) from the plurality of monitoring devices 20, the server 10 generates the tentative training data including the tentative feature amount based on the new device data (S22-1). Thereafter, the server 10 transmits (sends back) the tentative training data generated in S22-1 to the monitoring device 20 transmitting the calibrated new device data (the feature amount) (S22-2).

The monitoring device 20 generates the second calibration data based on the tentative feature amount included in the received tentative training data and the new device data (the feature amount) extracted by the monitoring unit 21 (S22-3). Then, the monitoring device 20 calibrates the new device data (the feature amount) extracted by the monitoring unit 21 based on the generated second calibration data (S22-4). Thereafter, the monitoring device 20 transmits the new device data (the feature amount) calibrated based on the second calibration data to the server 10 (S22-5).

When the server 10 receives the new device data (the feature amount) calibrated based on the second calibration data from the plurality of monitoring devices 20, the server 10 generates the tentative training data including the tentative feature amount based on the new device data (S22-6). Thereafter, the server 10 determines whether to repeat foregoing processes. When the server 10 determines to repeat the processes (Yes of S22-7), the server 10 returns the process to S22-2 to repeat the processes. Conversely when the server 10 determines not to further repeat the processes (No of S22-7), the process proceeds to S22-8.

In S22-8, the server 10 determines the finally generated tentative training data as the training data of the new electrical device and registers the training data in the training data storage unit 13. In this way, after the training data is registered in the training data storage unit 13, the processes described in the second exemplary embodiment can be executed.

According to the above-described present exemplary embodiment, it is possible to realize the same operational effects as those of the first and second exemplary embodiments. According to the present exemplary embodiment, it is possible to optimize the training data by repeating the processes of generating the tentative training data and the tentative calibration data.

As a modification example of the present exemplary embodiment, the server 10 may also execute at least one of "the process of generating the second calibration data to negate a difference between the tentative training data and the new device data based on the tentative training data and the new device data" and "the process of calibrating the new device data based on the second calibration data".

<Fourth Exemplary Embodiment>

First, an overview of the present exemplary embodiment will be described. In the present exemplary embodiment, the monitoring device 20 extracts new device data (feature amount) in accordance with the method described in the first exemplary embodiment and subsequently inquires of the server 10 whether the training data of the new electrical device is already stored in the server 10. Processing content is changed depending on an inquiry result.

Figure 21:
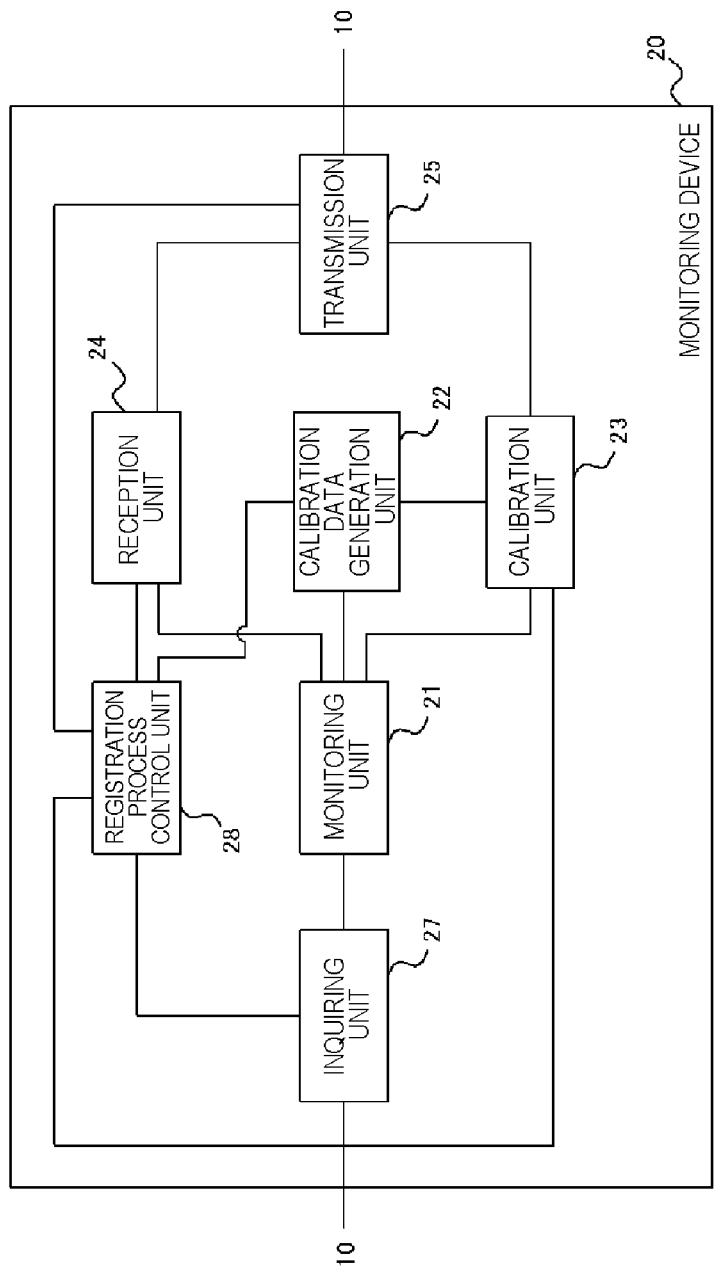
FIG. 21 is an exemplary functional block diagram illustrating the monitoring device 20 according to the exemplary embodiment.

FIG. 21 is an exemplary functional block diagram illustrating the monitoring device 20. As illustrated in FIG. 21, the monitoring device 20 includes a monitoring unit 21, a calibration data generation unit 22, a calibration unit 23, a reception unit 24, a transmission unit 25, an inquiring unit 27, and a registration process control unit 28. The monitoring device 20 may further include a device-side signal reception unit 26. The configurations of the monitoring unit 21, the calibration data generation unit 22, the calibration unit 23, the reception unit 24, the transmission unit 25, and the device-side signal reception unit 26 are the same as those of the first to third exemplary embodiments, and the description thereof will not be repeated.

When the monitoring unit 21 extracts the new device data of the new electrical device, the inquiring unit 27 inquires of the server 10 whether the training data of the new electrical device is already stored in the training data storage unit 13. For example, the inquiring unit 27 may transmit the new device data calibrated using the first calibration data by the calibration unit 23 to the server 10 and may inquire whether the training data associated with the feature amount matching the new device data is already stored in the training data storage unit 13. Alternatively, the inquiring unit 27 may transmit the identification information (the electrical device ID) of the new electrical device received by the reception unit 24 to the server 10 and may inquire whether the training data associated with the electrical device ID is already stored in the training data storage unit 13.

When the server 10 receives the inquiry, the server 10 searches the training data storage unit 13 and sends back a search result ("the data is stored", "the data is not stored," or "the data is stored but the data is insufficient"). The "insufficient data" is, for example, data in a state in which the third unit 123 described in the third exemplary embodiment determines that the repeated processes described in the third exemplary embodiment are to be repeated. For example, the insufficient data is data in which a change amount (for example, a difference from the immediately previous tentative feature amount) of the tentative feature amount is not within a predetermined threshold, data in which the processes are not repeated in a number of times determined in advance, or data in which the processes are not repeated during a period determined in advance.

In a case in which the reply from the server 10 is "the data is not stored" or "the data is stored but the data is insufficient", the registration process control unit 28 controls the calibration data generation unit 22, the calibration unit 23, the reception unit 24, and the transmission unit 25 such that the process of associating the identification information (the electrical device ID) of the new electrical device and the new device data calibrated based on the first calibration data and transmitting the identification information and the new device data to the server 10 by the transmission unit 25 is executed.

Conversely, in a case in which the reply from the server 10 is "the data is stored", the registration process control unit 28 requests the server 10 to transmit the training data of the electrical device and receives the training data. Then, the received training data is input to the monitoring unit 21 and the calibration data generation unit 22. The calibration data generation unit 22 generates the calibration data based on the input training data and the new device data (the feature amount) extracted by the monitoring unit 21 and inputs the calibration data to the monitoring unit 21. Thereafter, the monitoring unit 21 infers the operation states of the electrical devices (including the existing electrical devices and the new electrical devices) included in the monitoring target using the input training data and calibration data.

In a case in which the reply from the server 10 is "the data is stored", the registration process control unit 28 controls at least one of the calibration data generation unit 22, the calibration unit 23, the reception unit 24, and the transmission unit 25 such that the process of associating the identification information (the electrical device ID) of the new electrical device and the new device data calibrated based on the first calibration data and transmitting the identification information and the new device data to the server 10 by the transmission unit 25 is not executed. In a case in which at least one of the process of generating the first calibration data by the calibration data generation unit 22, the process of calibrating the new device data based on the first calibration data by the calibration unit 23, and the process of receiving an input of the identification information (the electrical device ID) of the new electrical device by the reception unit 24 is not executed, information transmitted to the server 10 by the transmission unit 25 is incomplete. Therefore, the process by the transmission unit 25 is not executed. When the information transmitted to the server 10 by the transmission unit 25 is complete but the transmission unit 25 is controlled not to transmit the information to the server 10, the process of transmitting predetermined information to the server 10 by the transmission unit 25 is not executed. The registration process control unit 28 may achieve the control in accordance with any method.

Figure 22:
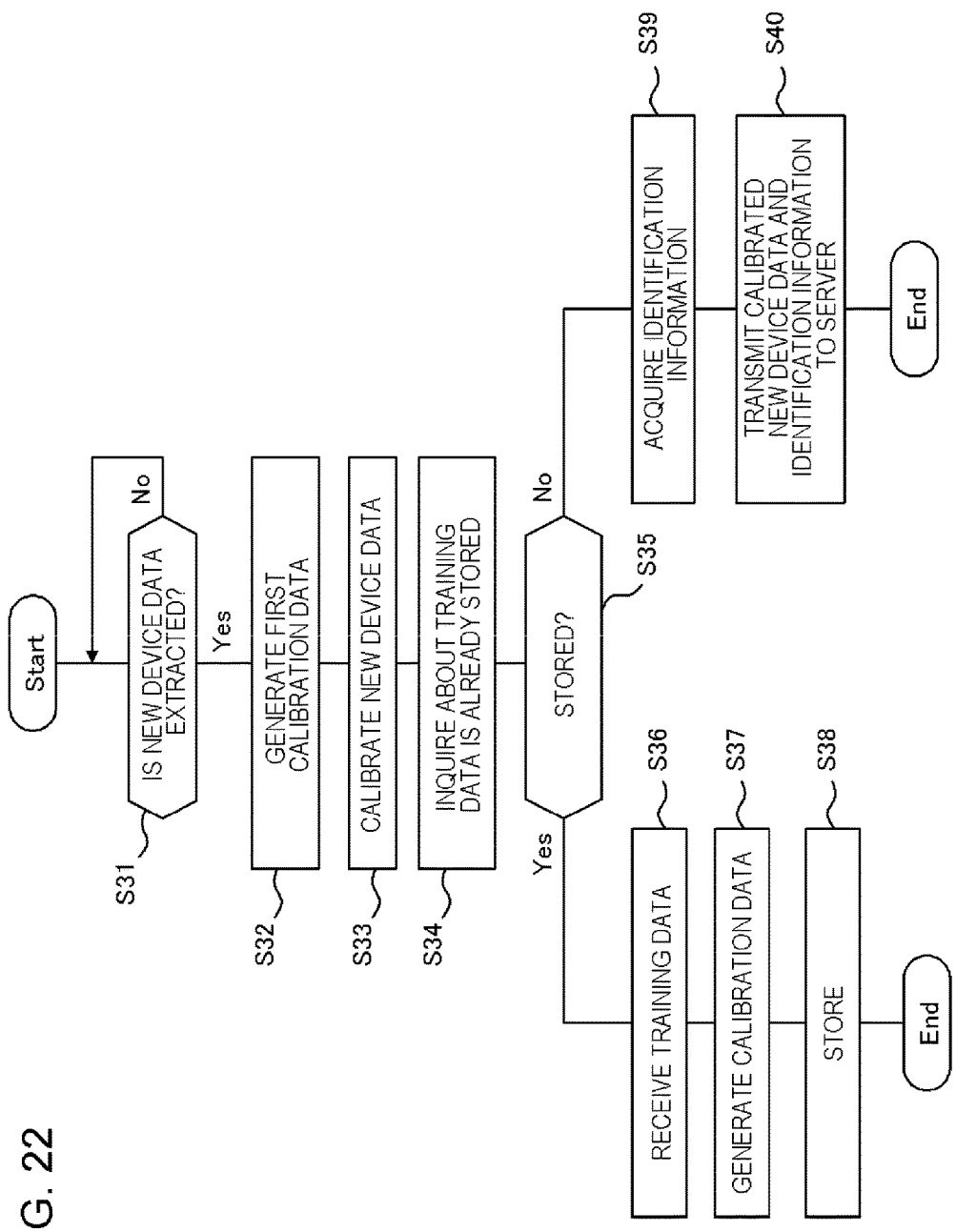
FIG. 22 is a flowchart illustrating an example of the flow of a process of the monitoring device 20 according to the exemplary embodiment.

FIG. 22 is a flowchart illustrating an example of the flow of the process of the monitoring device 20 according to the present exemplary embodiment.

When the monitoring unit 21 extracts the new device data (the feature amount of the electrical device newly installed to the monitoring unit) (Yes of S31), a subsequent process starts. While the monitoring unit 21 does not extract the new device data (No of S31), the monitoring device 20 enters a standby state.

When the monitoring unit 21 extracts the new device data (Yes of S31), the calibration data generation unit 22 generates the first calibration data (S32). Then, the calibration unit 23 calibrates the new device data extracted in S31 using the first calibration data generated in S32 (S33). Thereafter, the inquiring unit 27 transmits the calibrated new device data (the feature amount) to the server 10 and inquires whether the training data of the new device data is already stored in the training data storage unit (S34).

The server 10 searches the training data storage unit 13 using the received calibrated new device data (the feature amount) as a key. In a case in which the training data associated with the matching feature amount is found, the server 10 sends back to the monitoring device 20 a reply indicating "the data is stored". Conversely, in a case in which the training data associated with the matching feature amount is not found, the server 10 sends back to the monitoring device 20 a reply indicating "the data is not stored" or "the data is stored but the data is insufficient".

In a case in which the reply from the server 10 indicates "the data is stored" (Yes of S35), the registration process control unit 28 requests the server 10 to transmit the training data and receives the training data (S36). Thereafter, the calibration data generation unit 22 generates the calibration data based on the training data received in S36 and the new device data extracted in S31 (S37). Then, the training data received in S36 and the calibration data generated in S37 are associated and registered in the monitoring unit 21. Thereafter, the monitoring unit 21 infers the operation states of the electrical devices (including the existing electrical devices and the new electrical devices) included in the monitoring target using the newly registered training data and calibration data.

The registration process control unit 28 controls at least one of the reception unit 24 and the transmission unit 25 such that the process of associating the identification information (the electrical device ID) of the new electrical device and the new device data calibrated based on the first calibration data and transmitting the identification information and the new device data to the server 10 by the transmission unit 25 is not executed.

Conversely, in a case in which the reply from the server 10 is "the data is not stored" or "the data is stored but the data is insufficient" (No of S35), the reception unit 24 receives an input of the identification information (the electrical device ID) of the new electrical device (S39). Then, the transmission unit 25 associates the calibrated new device data calibrated in S33 and the identification information (the electrical device ID) of the new electrical device received in S39 and transmits the calibrated new device data and the identification information to the server 10 (S40).

As the foregoing modification example, instead of S32 and S33, "a process in which the reception unit 24 receives an input of the identification information (the electrical device ID) of the new electrical device" may be executed. In S34, the inquiring unit 27 may transmit the electrical device ID received by the reception unit 24 to the server 10 and inquire whether the training data corresponding to the electrical device ID is already stored in the training data storage unit 13.

In the case in which the reply from the server 10 indicates "the data is stored" (Yes of S35), the registration process control unit 28 may control at least one of the calibration data generation unit 22, the calibration unit 23, and the transmission unit 25 such that the process of associating the identification information (the electrical device ID) of the new electrical device and the new device data calibrated based on the first calibration data and transmitting the identification information and the new device data to the server 10 by the transmission unit 25 is not executed.

Further, in the case in which the reply from the server 10 is "the data is not stored" or "the data is stored but the data is insufficient" (No of S35), the calibration data generation unit 22 may subsequently generate the first calibration data and the calibration unit 23 may calibrate the new device data based on the first calibration data.

According to the above-described present exemplary embodiment, it is possible to achieve the same operational effects as those of the first to third exemplary embodiments.

In a case in which some time has passed from the release date of the new electrical device newly added to the monitoring unit, there is a high possibility of the training data of the electrical device being already registered in the server 10. In this case, when transmission and reception of the identification information and the new device data calibrated based on the first calibration data, transmission and reception of the tentative training data, transmission and reception of the new device data calibrated based on the second calibration data are executed between the server 10 and the monitoring device 20, an unnecessary processing burden is imposed on the server 10 or the monitoring device 20, which is not preferable. In the present exemplary embodiment, before such a process is executed, it is possible to confirm whether the training data of the new electrical device specified in a certain monitoring unit is already registered in the server 10 to change processing content according to the confirmation result. Therefore, it is possible to reduce inconvenience in which the server 10 or the monitoring device 20 executes an unnecessary process.

Here, examples of services realized based on results (estimation results of the operation states of the electrical devices) inferred by the monitoring devices 20 according to the first to fourth exemplary embodiments will be described.

For example, it is possible to provide advices for power saving. In the monitoring devices 20 according to the first to fourth exemplary embodiments, it is possible to ascertain temporal changes of the operation states of the electrical devices in a day (from 00:00 to 24:00). Based on such an output, it is possible to specify a time period in which the electrical devices are used in a large amount and provide advices for intentionally reducing the use of the electrical devices during the time period.

As another example, it is possible to provide a notification of a timing of maintenance of an electrical device (for example, cleaning of an air-conditioner). In the monitoring device 20 according to the first to fourth exemplary embodiments, it is possible to calculate an accumulated operation time of each electrical device by accumulating estimation results. For example, it is possible to provide a notification for prompting maintenance at a timing at which an accumulative time becomes a predetermined value. Current consumption, power consumption, a voltage, a measurement feature amount, and the like may change due to breakdown of an electrical device or deterioration of some components over time. Accordingly, for example, it is possible to provide a notification for prompting maintenance when such change is detected.

As still another example, it is possible to provide advices on use of a refrigerator. According to a loading state inside the refrigerator, current consumption, power consumption, a voltage, a measurement feature amount, and the like may change. In the monitoring device 20 according to first to fourth exemplary embodiments, such change can be detected. Based on the change, a warning against overstuffing or a prompt for increasing storage due to a decrease in storage can be notified of.

As still another example, in the monitoring device 20 according to the first to fourth exemplary embodiments, in comparison to a history of previous estimation results, it is possible to detect whether a use pattern of electrical devices is different from that at the normal time. In a case in which the use pattern of the electrical devices is different from the use pattern at the normal time, there is a possibility of a certain change (for example, service receivers are sick or involved in accidents) occurring in service receivers (users of the electronic devices). Accordingly, in such a case, a contact destination registered in advance can be notified of the warning.

As still another example, in the monitoring device 20 and the server 10 according to the first to fourth exemplary embodiments, a life rhythm or the like of a user can be inferred based on a use pattern of electronic devices (for example, a use pattern in a day). Accordingly, it is possible to propose a specific method of improving the life rhythm to a user of an irregular life rhythm (for example, activities are considerable in the night (use of many electronic devices in the night) and day activities and night activities irregularly occur) while referring to a life rhythm of a user who has a regular life rhythm stored in the server 10.

Hereinafter, examples of reference configurations will be appended.

1. A monitoring system including:
   a plurality of monitoring devices; and
   a server that communicates with each of the plurality of monitoring devices,
   the monitoring devices each including:
   a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data;
   a calibration data generation unit that generates first calibration data of the new electrical device based on the calibration data of the existing electrical devices;
   a calibration unit that calibrates the new device data based on the first calibration data;
   a reception unit that receives an input of identification information of the new electrical device; and
   a transmission unit that associates the identification information of the new electrical device with the new device data calibrated based on the first calibration data and transmits the identification information and the calibrated new device data to the server, and
   the server including:
   a signal reception unit that receives the calibrated new device data and the identification information of the new electrical device from the plurality of monitoring devices; and
   a training data generation unit that generates the training data of the new electrical device based on the calibrated new device data of the new electrical device received from each of the plurality of monitoring devices and registers the training data in a training data storage unit.

2. The monitoring system described in 1,
   wherein the training data generation unit includes
   a first unit that generates tentative training data including a tentative feature amount of the new electrical device based on the calibrated new device data of the new electrical device received from each of the plurality of monitoring devices, and
   a second unit that transmits the tentative training data to the monitoring devices,
   wherein the monitoring device further includes a device-side signal reception unit that receives the tentative training data,
   wherein the calibration data generation unit generates second calibration data for negating a difference between the tentative training data and the new device data based on the tentative training data and the new device data,
   wherein the calibration unit calibrates the new device data based on the second calibration data, and
   wherein the transmission unit associates the identification information of the new electrical device with the new device data calibrated based on the second calibration data and transmits the identification information and the calibrated new device data to the server.

3. The monitoring system described in 2,
   wherein the training data generation unit further includes a third unit that controls the first and second units such that the first and second units repeatedly execute the process of generating the tentative training data and the process of transmitting the tentative training data to the monitoring devices.

4. The monitoring system described in 3,
   wherein the third unit determines the tentative training data of the new electrical device obtained after repeating the processes executed by the first and second units as the training data of the new electrical device.

5. The monitoring system described in anyone of 1 to 5,
   wherein the monitoring unit infers operation states of the plurality of existing electrical devices and extracts the new device data based on the measurement data, the training data, and the calibration data.

6. The monitoring system described in 5,
   wherein the server further includes a transmission unit that transmits the training data of the new electrical device to the monitoring devices,
   wherein the calibration data generation unit generates third calibration data for negating a difference between the training data and the new device data based on the training data of the new electrical device and the new device data, and
   wherein the monitoring unit further infers operation states of the plurality of existing electrical devices and the new electrical device based on the training data of the new electrical device and the third calibration data.

7. The monitoring system described in anyone of 1 to 6,
   wherein the monitoring device further includes
   an inquiry unit that inquires of the server whether the training data of the new electrical device is stored in the training data storage unit when the new device data of the new electrical device is extracted, and
   a registration process control unit that executes control such that the transmission unit executes a process of associating the identification information of the new electrical device with the new device data calibrated based on the first calibration data and transmitting the identification information and the calibrated new device data to the server in a case in which the training data of the new electrical device is not stored as a result of the inquiry.

8. The monitoring system described in anyone of 1 to 7,
   wherein the monitoring device further includes an inquiry unit that inquires of the server whether the training data of the new electrical device is stored in the training data storage unit when the new device data of the new electrical device is extracted, and
   a registration process control unit that executes control such that the training data of the new electrical device is received from the server and the transmission unit does not execute the process of associating the identification information of the new electrical device with the new device data calibrated based on the first calibration data and transmitting the identification information and the calibrated new device data to the server in a case in which the training data of the new electrical device is stored as the result of the inquiry.

9. A monitoring device including:
   a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data, a calibration data generation unit that generates first calibration data of the new electrical device based on the calibration data of the existing electrical devices, a calibration unit that calibrates the new device data based on the first calibration data, a reception unit that receives an input of identification information of the new electrical device, and a transmission unit that associates the identification information of the new electrical device with the new device data calibrated based on the first calibration data and transmits the identification information and the calibrated new device data to a server.

10. A server including:

a signal reception unit that receives new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and a training data generation unit that generates the training data of the new electrical device based on the calibrated new device data of the new electrical device received from each of the plurality of monitoring devices and registers the training data in a training data storage unit.

11. A program causing a computer to function as:

a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data, a calibration data generation unit that generates first calibration data of the new electrical device based on the calibration data of the existing electrical devices, a calibration unit that calibrates the new device data based on the first calibration data, a reception unit that receives an input of identification information of the new electrical device, and a transmission unit that associates the identification information of the new electrical device with the new device data calibrated based on the first calibration data and transmits the identification information and the calibrated new device data to a server.

12. A program causing a computer to function as:

a signal reception unit that receives new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and a training data generation unit that generates the training data of the new electrical device based on the calibrated new device data of the new electrical device received from each of the plurality of monitoring devices and registers the training data in a training data storage unit.

13. A monitoring device operation method executed by a computer, the method comprising:

a monitoring step of, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracting new device data including the feature amount of a new electrical device different from the existing electrical devices from the measurement data, a calibration data generation step of generating first calibration data of the new electrical device based on the calibration data of the existing electrical devices, a calibration step of calibrating the new device data based on the first calibration data, a reception step of receiving an input of identification information of the new electrical device, and a transmission step of associating the identification information of the new electrical device with the new device data calibrated based on the first calibration data and transmitting the identification information and the calibrated new device data to a server.

14. A server operation method executed by a computer, the method including:

a signal reception step of receiving new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and a training data generation step of generating the training data of the new electrical device based on the calibrated new device data of the new electrical device received from each of the plurality of monitoring devices and registering the training data in a training data storage unit.

This application claims priority from Japanese Patent Application No. 2014-111331 filed on May 29, 2014, the content of which is incorporated herein by reference in its entirety.

The invention claimed is:

1. A monitoring system comprising:

a plurality of monitoring devices; and a server that communicates with each of the plurality of monitoring devices, the monitoring devices each including:

a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data;

a calibration data generation unit that generates first calibration data of the new electrical device based on the calibration data of the existing electrical devices;

a calibration unit that calibrates the new device data based on the first calibration data;

a reception unit that receives an input of identification information of the new electrical device; and a transmission unit that associates the identification information of the new electrical device with the new device data calibrated based on the first calibration data and transmits the identification information and the calibrated new device data to the server, and the server including:

a signal reception unit that receives the calibrated new device data and the identification information of the new electrical device from the plurality of monitoring devices; and a training data generation unit that generates the training data of the new electrical device based on the calibrated new device data of the new electrical device received from each of the plurality of monitoring devices and registers the training data in a training data storage unit.

2. The monitoring system according to claim 1,
wherein the training data generation unit includes
a first unit that generates tentative training data including a tentative feature amount of the new electrical device based on the calibrated new device data of the new electrical device received from each of the plurality of monitoring devices, and
a second unit that transmits the tentative training data to the monitoring devices,
wherein the monitoring device further includes a device-side signal reception unit that receives the tentative training data,
wherein the calibration data generation unit generates second calibration data for negating a difference between the tentative training data and the new device data based on the tentative training data and the new device data,
wherein the calibration unit calibrates the new device data based on the second calibration data, and
wherein the transmission unit associates the identification information of the new electrical device with the new device data calibrated based on the second calibration data and transmits the identification information and the calibrated new device data to the server.

3. The monitoring system according to claim 2,
wherein the training data generation unit further includes a third unit that controls the first and second units such that the first and second units repeatedly execute the process of generating the tentative training data and the process of transmitting the tentative training data to the monitoring devices.

4. The monitoring system according to claim 3,
wherein the third unit determines the tentative training data of the new electrical device obtained after repeating the processes executed by the first and second units as the training data of the new electrical device.

5. The monitoring system according to claim 1,
wherein the monitoring unit infers operation states of the plurality of existing electrical devices and extracts the new device data based on the measurement data, the training data, and the calibration data.

6. The monitoring system according to claim 5,
wherein the server further includes a transmission unit that transmits the training data of the new electrical device to the monitoring devices,
wherein the calibration data generation unit generates third calibration data for negating a difference between the training data of the new electrical device and the new device data based on the training data and the new device data, and
wherein the monitoring unit further infers operation states of the plurality of existing electrical devices and the new electrical device based on the training data of the new electrical device and the third calibration data.

7. The monitoring system according to claim 1,
wherein the monitoring device further includes
an inquiry unit that inquires of the server whether the training data of the new electrical device is stored in the training data storage unit when the new device data of the new electrical device is extracted, and
a registration process control unit that executes control such that the transmission unit executes a process of associating the identification information of the new electrical device with the new device data calibrated based on the first calibration data and transmitting the identification information and the calibrated new device data to the server in a case in which the training data of the new electrical device is not stored as a result of the inquiry.

8. The monitoring system according to claim 1,
wherein the monitoring device further includes an inquiry unit that inquires of the server whether the training data of the new electrical device is stored in the training data storage unit when the new device data of the new electrical device is extracted, and
a registration process control unit that executes control such that the training data of the new electrical device is received from the server and the transmission unit does not execute the process of associating the identification information of the new electrical device with the new device data calibrated based on the first calibration data and transmitting the identification information and the calibrated new device data to the server in a case in which the training data of the new electrical device is stored as the result of the inquiry.

9. A monitoring device comprising:
a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data, a calibration data generation unit that generates first calibration data of the new electrical device based on the calibration data of the existing electrical devices, a calibration unit that calibrates the new device data based on the first calibration data, a reception unit that receives an input of identification information of the new electrical device, and a transmission unit that associates the identification information of the new electrical device with the new device data calibrated based on the first calibration data and transmits the identification information and the calibrated new device data to a server.

10. A server comprising:
a signal reception unit that receives new device data which includes a feature amount of a new electrical device extracted from at least one piece of measurement data among current consumption, power consumption, and an input voltage and is obtained after calibrating a variation occurring in the measurement data depending on an installation environment of the new electrical device, and identification information of the new electrical device from a plurality of monitoring devices; and
a training data generation unit that generates training data of the new electrical device based on the calibrated new device data of the new electrical device received from each of the plurality of monitoring devices and registers the training data in a training data storage unit.

11. A non-transitory storage medium storing a program causing a computer to function as:
a monitoring unit that, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracts new device data including the feature amount of a new electrical device different from the existing electrical devices from the measurement data,
a calibration data generation unit that generates first calibration data of the new electrical device based on the calibration data of the existing electrical devices,
a calibration unit that calibrates the new device data based on the first calibration data,
a reception unit that receives an input of identification information of the new electrical device, and
a transmission unit that associates the identification information of the new electrical device with the new device data calibrated based on the first calibration data and transmits the identification information and the calibrated new device data to a server.

12. A non-transitory storage medium storing a program causing a computer to function as:
a signal reception unit that receives new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and
a training data generation unit that generates training data of the new electrical device based on the calibrated new device data of the new electrical device received from each of the plurality of monitoring devices and registers the training data in a training data storage unit.

13. A monitoring device operation method executed by a computer, the method comprising:
a monitoring step of, based on measurement data of at least one among current consumption, power consumption, and an input voltage, training data including a feature amount at the time of operation of each of a plurality of existing electrical devices, and calibration data of each of the existing electrical devices used to calibrate a variation occurring in the measurement data depending on an installation environment of each of the plurality of existing electrical devices, extracting new device data including the feature amount of a new electrical device different from the existing electrical devices from the measurement data,
a calibration data generation step of generating first calibration data of the new electrical device based on the calibration data of the existing electrical devices,
a calibration step of calibrating the new device data based on the first calibration data,
a reception step of receiving an input of identification information of the new electrical device, and
a transmission step of associating the identification information of the new electrical device with the new device data calibrated based on the first calibration data and transmitting the identification information and the calibrated new device data to a server.

14. A server operation method executed by a computer, the method comprising:
a signal reception step of receiving new device data which includes a feature amount of a new electrical device extracted from measurement data of at least one among current consumption, power consumption, and an input voltage and is obtained after calibrating a variation occurring in the measurement data depending on an installation environment of the new electrical device, and identification information of the new electrical device from a plurality of monitoring devices; and
a training data generation step of generating training data of the new electrical device based on the calibrated new device data of the new electrical device received from each of the plurality of monitoring devices and registering the training data in a training data storage unit.

* * * * *